(12) United States Patent
Sesti et al.

(10) Patent No.: US 11,457,134 B2
(45) Date of Patent: *Sep. 27, 2022

(54) VEHICULAR CAMERA AND LENS ASSEMBLY

(71) Applicant: MAGNA ELECTRONICS INC., Auburn Hills, MI (US)

(72) Inventors: Matthew C. Sesti, Williamston, MI (US); Robert A. Devota, Durand, MI (US); Yuesheng Lu, Farmington Hills, MI (US); Steven V. Byrne, Goodrich, MI (US); Joel S. Gibson, Linden, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 118 days.

This patent is subject to a terminal disclaimer.

(21) Appl. No.: 17/248,780

(22) Filed: Feb. 8, 2021

(65) Prior Publication Data

US 2021/0168268 A1     Jun. 3, 2021

Related U.S. Application Data

(63) Continuation of application No. 16/946,764, filed on Jul. 6, 2020, now Pat. No. 10,917,548, which is a
(Continued)

(51) Int. Cl.
*H04N 5/225* (2006.01)
*G02B 7/02* (2021.01)
(Continued)

(52) U.S. Cl.
CPC .......... *H04N 5/2254* (2013.01); *B60R 11/04* (2013.01); *G02B 7/003* (2013.01); *G02B 7/02* (2013.01);
(Continued)

(58) Field of Classification Search
CPC .... B60R 11/04; H04N 5/2254; H04N 5/2252; H04N 5/2253; H04N 5/2257; G02B 7/003;
(Continued)

(56) References Cited

U.S. PATENT DOCUMENTS 4,712,879 A   12/1987  Lynam et al.
4,786,966 A   11/1988  Hanson et al.
(Continued)

FOREIGN PATENT DOCUMENTS

CN          01059596 A    3/1992
CN           1743887 A    3/2006
(Continued)

OTHER PUBLICATIONS

International Search Report and Written Opinion dated Jan. 15, 2013, from corresponding PCT Application No. PCT/US2012/061548.

*Primary Examiner* — George R Koch
(74) *Attorney, Agent, or Firm* — Honigman LLP

(57) ABSTRACT

A camera sub-assembly for a vehicular camera includes a lens barrel having a cylinder accommodating a plurality of lens optics, and an annular flange extending radially outward from the cylinder. The cylinder is received in a receiving structure of a lens holder so that an annular attaching surface of the lens barrel is juxtaposed with an annular attaching surface of the receiving structure with a cured adhesive disposed between and contacting both of the annular attaching surfaces. The cured adhesive includes an adhesive material. With the lens optics aligned with respect to an imaging array of a printed circuit board attached at the lens holder, the adhesive material is cured to a partially-cured state via exposure of the adhesive material to ultraviolet light. With the joined lens barrel and lens holder construction at a further curing station, the adhesive material is
(Continued)

further cured from the partially-cured state to a more-cured state.

96 Claims, 13 Drawing Sheets

Related U.S. Application Data continuation of application No. 16/025,062, filed on Jul. 2, 2018, now Pat. No. 10,708,476, which is a continuation of application No. 15/056,011, filed on Feb. 29, 2016, now Pat. No. 10,015,377, which is a continuation of application No. 14/353,808, filed as application No. PCT/US2012/061548 on Oct. 24, 2012, now Pat. No. 9,277,104, said application No. 14/353,808 is a continuation-in-part of application No. 14/033,964, filed on Sep. 23, 2013, now Pat. No. 9,338,334, which is a continuation of application No. 13/260,400, filed as application No. PCT/US2010/028621 on Mar. 25, 2010, now Pat. No. 82,542,451.

(60) Provisional application No. 61/550,664, filed on Oct. 24, 2011, provisional application No. 61/232,544, filed on Aug. 10, 2009, provisional application No. 61/163,240, filed on Mar. 25, 2009.

(51) Int. Cl.
| | |
|---|---|
| *G02B 7/04* | (2021.01) |
| *G02B 13/00* | (2006.01) |
| *G02B 27/00* | (2006.01) |
| *H01L 27/146* | (2006.01) |
| *H04N 5/232* | (2006.01) |
| *B60R 11/04* | (2006.01) |
| *G02B 27/62* | (2006.01) |
| *G02B 7/00* | (2021.01) |

(52) U.S. Cl.
CPC .............. *G02B 7/025* (2013.01); *G02B 7/04* (2013.01); *G02B 13/001* (2013.01); *G02B 27/0025* (2013.01); *G02B 27/62* (2013.01); *H01L 27/14618* (2013.01); *H01L 27/14625* (2013.01); *H04N 5/2252* (2013.01); *H04N 5/2253* (2013.01); *H04N 5/2257* (2013.01); *H04N 5/23293* (2013.01); *H01L 2924/0002* (2013.01); *Y10T 29/49002* (2015.01)

(58) Field of Classification Search
CPC ........ G02B 7/025; G02B 7/04; G02B 13/001; G02B 27/0025; G02B 27/62; H01L 27/14618; H01L 27/14625; H01L 2924/0002; Y10T 29/49002; B29C 66/91411; B29C 66/91423; B29C 66/9231; B29C 66/92; B29C 65/7811; B29C 65/7802
See application file for complete search history.

(56) References Cited

U.S. PATENT DOCUMENTS

| | | |
|---|---|---|
| 5,073,012 A | 12/1991 | Lynam |
| 5,076,673 A | 12/1991 | Lynam et al. |
| 5,115,346 A | 5/1992 | Lynam |
| 5,140,455 A | 8/1992 | Varaprasad et al. |
| 5,142,407 A | 8/1992 | Varaprasad et al. |
| 5,151,816 A | 9/1992 | Varaprasad et al. |
| 5,253,109 A | 10/1993 | O'Farrell et al. |
| 5,371,659 A | 12/1994 | Pastrick et al. |
| 5,406,414 A | 4/1995 | O'Farrell et al. |
| 5,497,306 A | 3/1996 | Pastrick |
| 5,525,264 A | 6/1996 | Cronin et al. |
| 5,550,677 A | 8/1996 | Schofield et al. |
| 5,559,556 A | 9/1996 | Kagebeck |
| 5,567,360 A | 10/1996 | Varaprasad et al. |
| 5,610,756 A | 3/1997 | Lynam et al. |
| 5,668,663 A | 9/1997 | Varaprasad et al. |
| 5,669,699 A | 9/1997 | Pastrick et al. |
| 5,670,935 A | 9/1997 | Schofield et al. |
| 5,724,187 A | 3/1998 | Varaprasad et al. |
| 5,760,962 A | 6/1998 | Schofield et al. |
| 5,796,094 A | 8/1998 | Schofield et al. |
| 5,821,532 A | 10/1998 | Beaman et al. |
| 5,823,654 A | 10/1998 | Pastrick et al. |
| 5,854,708 A | 12/1998 | Komatsu et al. |
| 5,872,332 A | 2/1999 | Verma |
| 5,877,897 A | 3/1999 | Schofield et al. |
| 5,910,854 A | 6/1999 | Varaprasad et al. |
| 5,949,331 A | 9/1999 | Schofield et al. |
| 5,975,017 A | 11/1999 | Cameron |
| 6,002,544 A | 12/1999 | Yatsu |
| 6,013,372 A | 1/2000 | Hayakawa et al. |
| 6,071,606 A | 6/2000 | Yamazaki et al. |
| 6,072,814 A | 6/2000 | Ryan et al. |
| 6,097,023 A | 8/2000 | Schofield et al. |
| 6,117,193 A | 9/2000 | Glenn |
| 6,151,065 A | 11/2000 | Steed et al. |
| 6,154,306 A | 11/2000 | Varaprasad et al. |
| 6,176,602 B1 | 1/2001 | Pastrick et al. |
| 6,178,034 B1 | 1/2001 | Allemand et al. |
| 6,193,378 B1 | 2/2001 | Tonar et al. |
| 6,201,642 B1 | 3/2001 | Bos |
| 6,222,447 B1 | 4/2001 | Schofield et al. |
| 6,259,475 B1 | 7/2001 | Ramachandran et al. |
| 6,276,821 B1 | 8/2001 | Pastrick et al. |
| 6,292,311 B1 | 9/2001 | Bohn et al. |
| 6,302,545 B1 | 10/2001 | Schofield et al. |
| 6,320,176 B1 | 11/2001 | Schofield et al. |
| 6,353,392 B1 | 3/2002 | Schofield et al. |
| 6,396,397 B1 | 5/2002 | Bos et al. |
| 6,454,449 B2 | 9/2002 | Nestell et al. |
| 6,481,003 B1 | 11/2002 | Maeda |
| 6,483,101 B1 | 11/2002 | Webster |
| 6,498,620 B2 | 12/2002 | Schofield et al. |
| 6,523,964 B2 | 2/2003 | Schofield et al. |
| 6,535,242 B1 | 3/2003 | Strumolo et al. |
| 6,559,435 B2 | 5/2003 | Schofield et al. |
| 6,559,439 B1 | 5/2003 | Tsuchida et al. |
| 6,590,658 B2 | 7/2003 | Case et al. |
| 6,603,612 B2 | 8/2003 | Nakano |
| 6,611,202 B2 | 8/2003 | Schofield et al. |
| 6,651,187 B2 | 11/2003 | Lacey, III |
| 6,654,187 B2 | 11/2003 | Ning |
| 6,690,268 B2 | 2/2004 | Schofield et al. |
| 6,717,610 B1 | 4/2004 | Bos et al. |
| 6,757,109 B2 | 6/2004 | Bos |
| 6,805,737 B2 | 10/2004 | Godeke et al. |
| 6,806,452 B2 | 10/2004 | Bos et al. |
| 6,822,563 B2 | 11/2004 | Bos et al. |
| 6,831,261 B2 | 12/2004 | Schofield et al. |
| 6,891,563 B2 | 5/2005 | Schofield et al. |
| 6,897,432 B2 | 5/2005 | Schmidtke et al. |
| 6,946,978 B2 | 9/2005 | Schofield |
| 6,977,619 B2 | 12/2005 | March et al. |
| 7,004,606 B2 | 2/2006 | Schofield |
| 7,005,974 B2 | 2/2006 | McMahon et al. |
| 7,015,944 B2 | 3/2006 | Holz et al. |
| 7,031,075 B2 | 4/2006 | Tsuji |
| 7,038,577 B2 | 5/2006 | Pawlicki et al. |
| 7,095,123 B2 | 8/2006 | Prior |
| 7,095,572 B2 | 8/2006 | Lee et al. |
| 7,123,168 B2 | 10/2006 | Schofield |
| 7,215,479 B1 | 5/2007 | Bakin |
| 7,255,451 B2 | 8/2007 | McCabe et al. |
| 7,268,957 B2 | 9/2007 | Frenzel et al. |
| 7,339,149 B1 | 3/2008 | Schofield et al. |
| 7,370,983 B2 | 5/2008 | DeWind et al. |
| 7,391,458 B2 | 6/2008 | Sakamoto |
| 7,419,315 B2 | 9/2008 | Hirata et al. |

(56) References Cited

U.S. PATENT DOCUMENTS

| | | |
|---|---|---|
| 7,423,665 B2 | 9/2008 | Ray et al. |
| 7,453,509 B2 | 11/2008 | Losehand et al. |
| 7,599,134 B2 | 10/2009 | Bechtel et al. |
| 7,768,574 B2 | 8/2010 | Humpston |
| 7,965,336 B2 | 6/2011 | Bingle et al. |
| 8,064,146 B2 | 11/2011 | Iwasaki |
| 8,120,652 B2 | 2/2012 | Bechtel et al. |
| 8,318,512 B2 | 11/2012 | Shah et al. |
| 8,542,451 B2 * | 9/2013 | Lu ............... H01L 27/14625 359/819 |
| 9,277,104 B2 | 3/2016 | Sesti et al. |
| 9,338,334 B2 * | 5/2016 | Lu ............... H01L 27/14625 |
| 10,015,377 B2 | 7/2018 | Sesti et al. |
| 10,270,949 B2 * | 4/2019 | Lu ............... G02B 7/02 |
| 10,708,476 B2 | 7/2020 | Sesti et al. |
| 10,917,548 B2 | 2/2021 | Sesti et al. |
| 11,146,713 B2 * | 10/2021 | Lu ............... G02B 27/0025 |
| 2002/0159270 A1 | 10/2002 | Lynam et al. |
| 2003/0090569 A1 | 5/2003 | Poechmueller |
| 2003/0137595 A1 | 7/2003 | Takachi |
| 2004/0016870 A1 | 1/2004 | Pawlicki et al. |
| 2004/0032321 A1 | 2/2004 | McMahon et al. |
| 2004/0051634 A1 | 3/2004 | Schofield et al. |
| 2005/0104995 A1 | 5/2005 | Spryshak et al. |
| 2005/0190283 A1 | 9/2005 | Ish-Shalom et al. |
| 2005/0232469 A1 | 10/2005 | Schofield et al. |
| 2005/0274883 A1 | 12/2005 | Nagano |
| 2006/0038668 A1 | 2/2006 | DeWard et al. |
| 2006/0049533 A1 | 3/2006 | Kamoshita |
| 2006/0050018 A1 | 3/2006 | Hutzel et al. |
| 2006/0054802 A1 | 3/2006 | Johnston |
| 2006/0056077 A1 | 3/2006 | Johnston |
| 2006/0061008 A1 | 3/2006 | Kamer et al. |
| 2006/0065436 A1 | 3/2006 | Gally et al. |
| 2006/0077575 A1 | 4/2006 | Nakai et al. |
| 2006/0125919 A1 | 6/2006 | Camilleri et al. |
| 2006/0171704 A1 | 8/2006 | Bingle et al. |
| 2006/0184297 A1 | 8/2006 | Higgins-Luthman |
| 2007/0279518 A1 | 12/2007 | Apel et al. |
| 2008/0024883 A1 | 1/2008 | Iwasaki |
| 2008/0043105 A1 | 2/2008 | Kallhammer et al. |
| 2009/0010494 A1 | 1/2009 | Bechtel et al. |
| 2009/0244361 A1 | 10/2009 | Gebauer et al. |
| 2010/0279439 A1 | 11/2010 | Shah et al. |
| 2011/0298968 A1 | 12/2011 | Tseng et al. |
| 2014/0022657 A1 | 1/2014 | Lu et al. |
| 2022/0030145 A1 * | 1/2022 | Lu ............... B60R 11/04 |

FOREIGN PATENT DOCUMENTS

| | | |
|---|---|---|
| EP | 1271214 A1 | 1/2003 |
| EP | 1351316 A2 | 10/2003 |
| EP | 1605520 A1 | 12/2005 |
| JP | 08084277 | 3/1996 |
| JP | 2006-293100 A | 10/2006 |
| JP | 2006-350372 A | 12/2006 |
| WO | 2001044850 A2 | 6/2001 |
| WO | 2004010679 A2 | 1/2004 |
| WO | 2006029995 A1 | 3/2006 |
| WO | 2006029996 A1 | 3/2006 |
| WO | 2007053404 A2 | 5/2007 |
| WO | 2010/111465 A1 | 9/2010 |

* cited by examiner

- Contrast sensitivity functions of seven age groups -
(after Schieber, 1992)

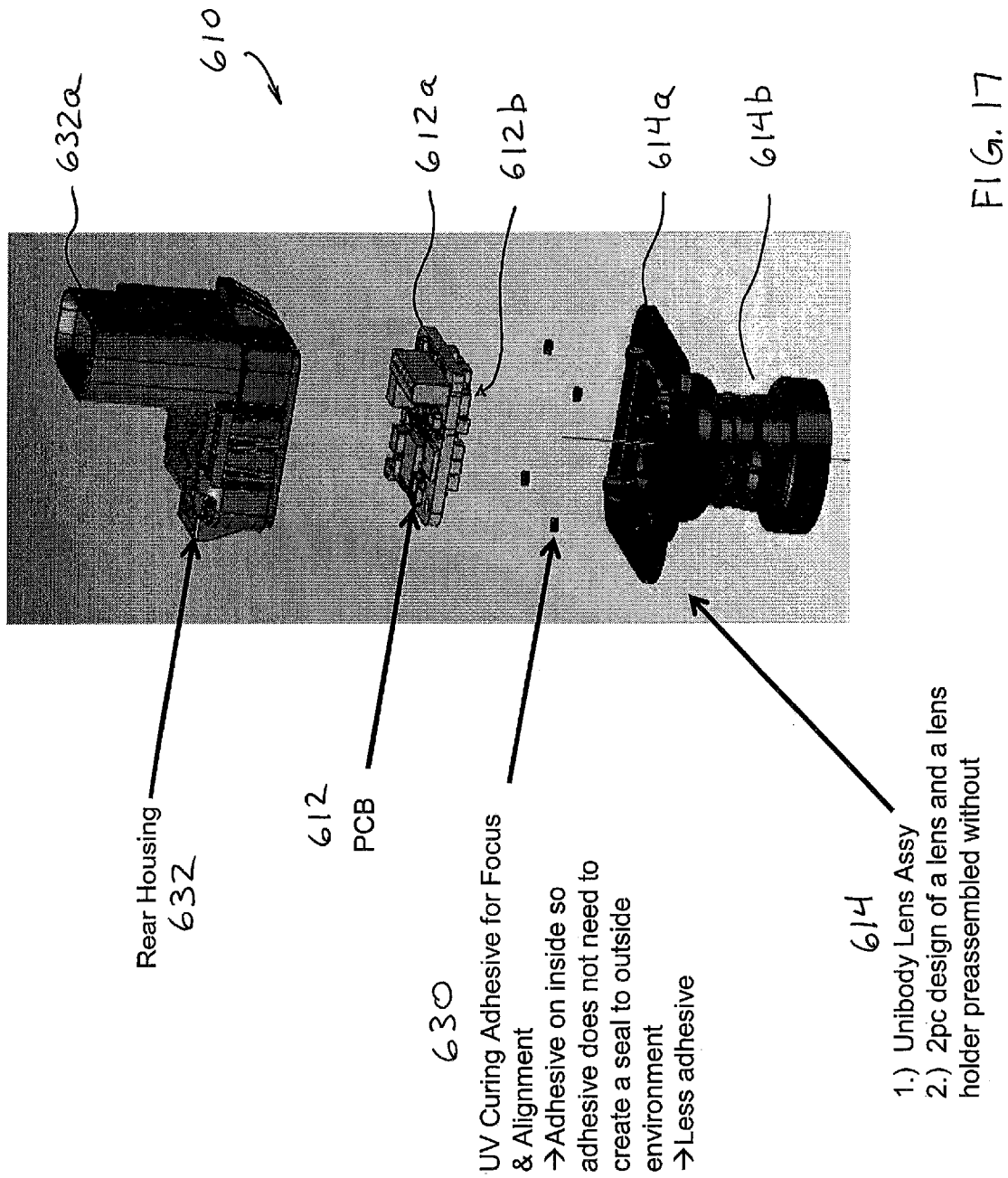

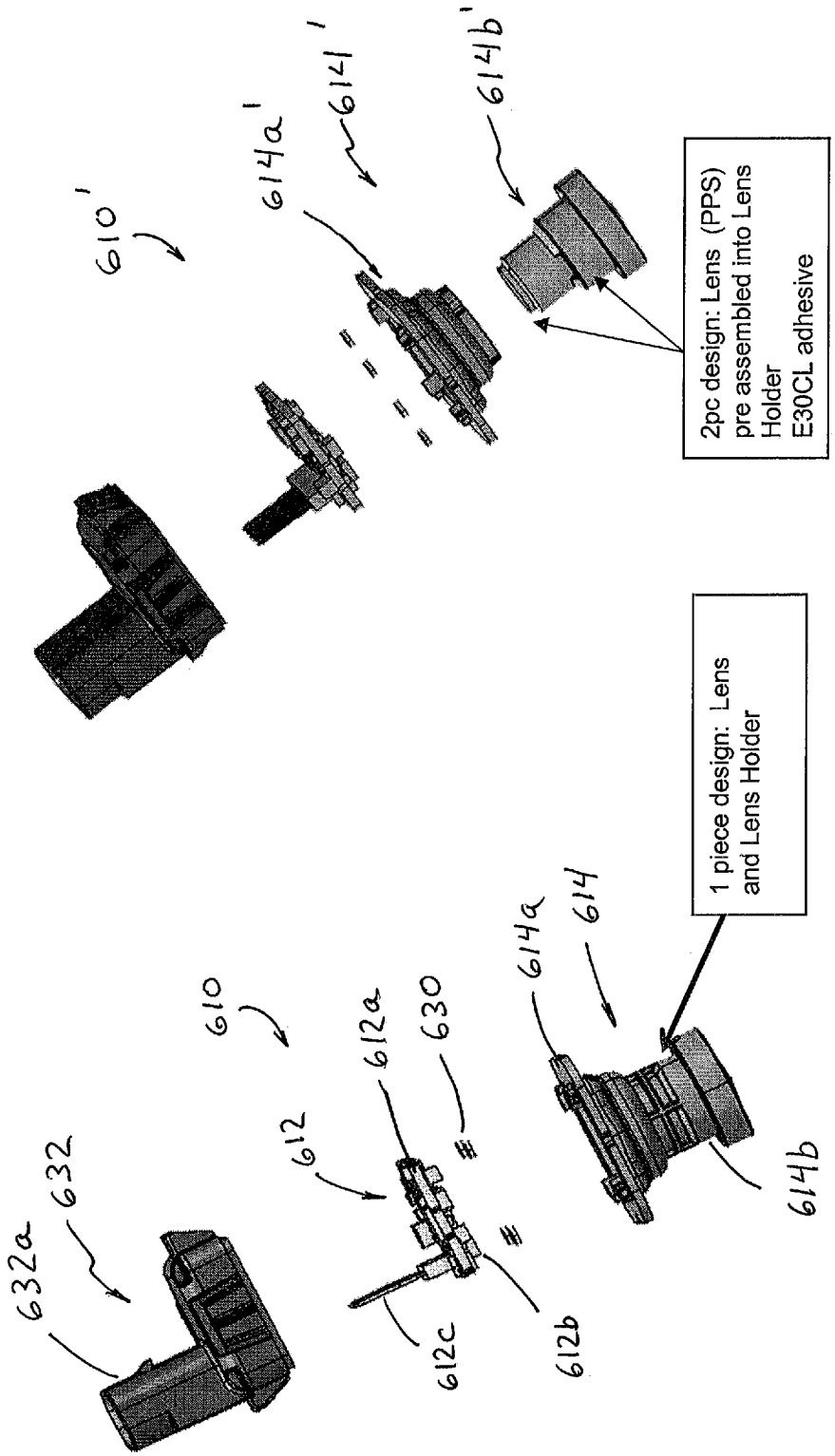

650
652
 Load of integrated Lens holder 
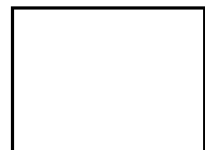 Auto Plasmatreat
Auto Dispense adhesive
654
656
 Auto Pick of PCB from tray/stacker
X, Y & Z Focus of PCB
Flash UV Cure System
658
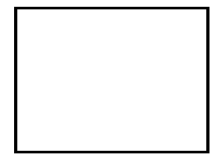 Secondary UV Cure system
 Offload of Camera S/A 
660
FIG. 20

VEHICULAR CAMERA AND LENS ASSEMBLY

CROSS REFERENCE TO RELATED APPLICATIONS

The present application is a continuation of U.S. patent application Ser. No. 16/946,764, filed Jul. 6, 2020, now U.S. Pat. No. 10,917,548, which is a continuation of U.S. patent application Ser. No. 16/025,062, filed Jul. 2, 2018, now U.S. Pat. No. 10,708,476, which is a continuation of U.S. patent application Ser. No. 15/056,011, filed Feb. 29, 2016, now U.S. Pat. No. 10,015,377, which is a continuation of U.S. patent application Ser. No. 14/353,808, filed Apr. 24, 2014, now U.S. Pat. No. 9,277,104, which is a 371 national phase filing of PCT Application No. PCT/US2012/061548, filed Oct. 24, 2012, which claims the filing benefit of U.S. provisional application, Ser. No. 61/550,664, filed Oct. 24, 2011, which is hereby incorporated herein by reference in its entirety, and U.S. patent application Ser. No. 14/353,808 is a continuation-in-part of U.S. patent application Ser. No. 14/033,964, filed Sep. 23, 2013, now U.S. Pat. No. 9,338,334, which is a continuation of U.S. patent application Ser. No. 13/260,400, filed Sep. 26, 2011, now U.S. Pat. No. 8,542,451, which is a 371 national phase filing of PCT Application No. PCT/US2010/028621, filed Mar. 25, 2010, which claims the benefit of U.S. provisional application Ser. No. 61/232,544, filed Aug. 10, 2009, and Ser. No. 61/163,240, filed Mar. 25, 2009.

FIELD OF INVENTION

The invention relates to vehicular cameras, and more particularly, to low cost construction and assembly of such cameras.

BACKGROUND OF THE INVENTION

Vehicular cameras are used for a variety of purposes, such as to assist a driver in avoiding obstacles behind a vehicle when backing up, and to detect imminent collisions ahead of the vehicle when driving forward. A vehicular camera includes a lens that focuses video input on an image sensor provided on an imager. In general, the position of the lens relative to the image sensor can impact the quality of the video input received by the image sensor. For example, if the lens is positioned such that the video input is not in focus, then the video information passed to the driver may be blurry, and other vehicular systems, such as a collision detection system for example, may not function as well as they otherwise could. As the size of the camera is reduced, the positioning of the lens relative to the image sensor may be relatively more critical, at least because small variations in position can result in relatively large changes in angular offset. Therefore, the positioning of the lens relative to the image sensor may be particularly critical for vehicular rearview cameras. Furthermore, it is important that the camera be capable of holding the lens in position over a selected period of time under certain operating conditions, so that the performance of the camera is maintained over a useful operating life.

Several aspects of the camera may contribute to the overall tolerance in the position of the lens relative to the image sensor. For example, for lenses and lens holders that are threaded, the threaded connection therebetween has a tolerance associated with it. The angle of cast of the lens holder has a tolerance associated with it. The position of the imager has a tolerance associated with it.

It is desirable to provide a more integrated, lower cost camera assembly with means for positioning the lens relative to the imager within tolerance.

SUMMARY OF THE INVENTION

In one aspect, the invention is directed to a vehicular camera having a lens that is mounted to a lens holder and is held in position by a selected adhesive. The adhesive is capable of being initially cured relatively quickly by exposure to UV light for supporting the lens relative to the lens holder. The adhesive is further capable of being cured by exposure to a secondary curing condition, such as by exposure to heat, to achieve a fully cured strength, which may take a relatively longer period of time, such as minutes or hours.

By providing an adhesive that is initially curable quickly but that reaches a selected fully cured strength and selected performance characteristics, the camera lends itself to having the lens and/or imager circuit element or printed circuit board (PCB) positioned by a robot or a multi-axis motion system and then having the adhesive cured quickly to fix the relative position of the lens and the imager PCB so that the camera can be transferred from the robot or the multi-axis motion system to a second curing fixture for exposure to the secondary curing condition to fully cure the adhesive. Thus, the robot or the multi-axis motion system, which may be a relatively expensive component of a system used to manufacture the camera, can be used to align the lens or imager PCB and hold the assembly for a short period of time during the initial curing stage, and then the partially cured assembly may be moved to the secondary curing station and the robot or the multi-axis motion system may be used to adjust and align the lens of another camera while the first camera is being fully cured. The robot or multi-axis system is operable to grab and move objects in up to six degrees of motion or six axes of motion: translational movement in three generally orthogonal translational axes (in the x, y and z directions) and rotational movement about three generally orthogonal rotational axes (commonly referred to as pitch, yaw and roll). In the embodiments described below, some require all six axes of motion while some require only five axes of motion (such as motion in the x, y and z direction, and pitch and yaw rotational motion), or even less number of axes of motion, depending on the application requirements. For the simplicity reason, we will refer to all multi-axis motion systems herein as "robots" or "robotic devices". The robot of the present invention provides for roll or rotation about the optical axis of the lens or lens assembly in addition to the translational movement in the x, y and z directions and in addition to the pitch and yaw motions, thus providing enhanced and more precise and accurate placement and alignment of the lens at the imager circuit element or printed circuit board.

According to an aspect of the present invention, a method of assembling a vehicular camera includes providing a lens assembly comprising a base portion, a lens barrel and a plurality of optical elements in the lens barrel. A circuit element is provided that comprises a circuit board and an imaging array established at the circuit board. At least one adhesive bead is dispensed at the base portion of the lens assembly and/or at the circuit element. The circuit element is placed at base portion of the lens assembly with the at least one adhesive bead between the circuit element and the base portion, and the optical elements are aligned with the imaging array when the circuit element is placed at the base portion and in contact with the adhesive bead. The at least one adhesive bead is cured to a first cure level via exposure of the at least one adhesive bead to ultraviolet light. The at least one adhesive bead is further cured to a further cure level via a further exposure of the at least one adhesive bead to ultraviolet light. The lens assembly and the circuit element are moved to a second curing stage and the at least one adhesive bead is cured to a second cure level via heating the at least one adhesive bead to an elevated temperature for a selected period of time. A housing portion is attached to the base portion of the lens assembly to encase the circuit element and to substantially seal the housing portion and the base portion together.

The adhesive may comprise any suitable adhesive, such as an adhesive that may be partially cured via exposure to ultraviolet (UV) light and fully cured via exposure to heat, such as, for example, adhesive AD VE 43812 by Delo Industrial Adhesives of Windach, Germany, such as described in U.S. patent application Ser. No. 13/260,400, filed Sep. 26, 2011, now U.S. Pat. No. 8,542,451, and PCT Application No. PCT/US2010/028621, filed Mar. 25, 2010 and published Sep. 30, 2010 as International Publication No. WO 2010/111465, which are hereby incorporated herein by reference in their entireties.

These and other objects, advantages, purposes and features of the present invention will become apparent upon review of the following specification in conjunction with the drawings.

BRIEF DESCRIPTION OF THE DRAWINGS

The invention will now be described by way of example only with reference to the attached drawings in which:

FIG. 17 is an exploded perspective view of a camera assembly in accordance with the present invention;

FIG. 18 is another exploded perspective view of the camera assembly of FIG. 17;

FIG. 19 is an exploded perspective view of another camera assembly of the present invention;

FIG. 20 is a block diagram of the assembly process for assembling the camera assembly of FIGS. 17 and 18;

DETAILED DESCRIPTION OF THE INVENTION

Figure 2:
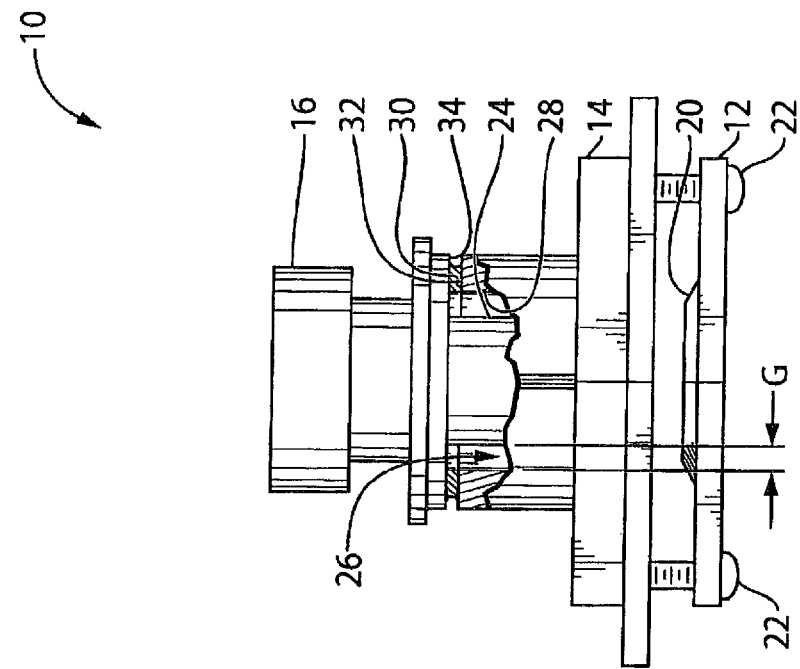
FIG. 2 is a cutaway side view of the vehicular camera shown in FIG. 1, in an assembled state.

Referring now to the drawings and the illustrative embodiments depicted therein, a camera is assembled with a circuit board or element (such as a printed circuit board comprising a semiconductor substrate and circuitry established thereon and having an imaging array disposed or established thereat) adhered to a lens assembly so that the lens optics of the lens assembly are precisely aligned with the imaging array of the circuit element. The present invention provides for a two stage curing process that includes an initial or first or partial curing of the adhesive when the lens optics are aligned with the imaging array and mechanically held in place, such as via a robot or the like, and then a second or subsequent or full curing of the partially cured adhesive at a separate curing station so that the robot, which functions to hold and place and align the imaging array and lens optics, can be used for assembling other cameras while the first camera is being fully cured (which can take several minutes in a heat chamber or the like).

Conventionally, a three, four or five axis movable stage (that provides for movement in the x, y and z directions and may provide for pitch and/or yaw adjustment or motion) has been used for the placement and gluing of a lens or lens assembly to an imager surface or circuit element. Such a five axis adjustment has the disadvantage of not being able to achieve a roll motion or rotation (along the optical axis) of the imager or lens during the placement and gluing process. For example, if the imager is not properly aligned and oriented relative to the camera body, when the camera is later mounted at a vehicle at the selected or appropriate orientation relative to the vehicle mounting structure, the imager may not be aligned or oriented properly with respect to the vehicle, such that the images captured by the imager may be skewed or otherwise not suitable for viewing and discerning by the driver of the vehicle.

We have found that use of a six axis robot or six axis stage, which includes roll capability or rotation about the optical axis (in addition to translational motion in the x, y and z directions and pitch and yaw rotational motion), overcomes the disadvantages of known movable stages and provides for enhanced alignment and positioning of the lens optics and imager relative to the camera body. For example, the robot and method of the present invention provides three generally orthogonal axes of rotation (pitch, yaw and roll) of a head and three generally orthogonal axes of translation (in the x, y and z directions) of the head to provide enhanced or more accurate alignment and/or placement and/or movement of the lens and imager circuit element assembly to the camera body during the placement and gluing process. As a result of this adjustment and alignment capability, the rotational tolerances of the imager relative to the camera body can be corrected or minimized.

The present invention may provide for adhering the circuit board to a base portion of a lens assembly, such as by holding the lens assembly in a fixture and using a robot to position and align and place the circuit board at the lens assembly and at the adhesive bead or beads or dots dispensed at the base portion of the lens assembly, and to align the imaging array with the lens optics, such as discussed below with respect to FIGS. 17-22. Optionally, the present invention may provide for adhering a lens barrel (with lens optics therein) to a barrel receiving portion of the camera (and attached to a circuit board or element with an imaging array established thereat), with a robot adjusting or aligning the lens barrel and optics relative to the circuit board and imaging array, such as discussed below with respect to FIGS. 1-16, and such as by utilizing aspects of the cameras and systems and methods described in U.S. patent application Ser. No. 13/260,400, filed Sep. 26, 2011, now U.S. Pat. No. 8,542,451, which is a 371 national phase application of PCT Application No. PCT/US2010/028621, filed Mar. 25, 2010 and published Sep. 30, 2010 as International Publication No. WO 2010/111465, which claims the benefits of U.S. provisional applications, Ser. No. 61/163,240, filed Mar. 25, 2009, and Ser. No. 61/232,544, filed Aug. 10, 2009, which are all hereby incorporated herein by reference in their entireties.

Embodiment 1—Use of UV-Curable Adhesive to Mount Lens to Holder

Figure 1:
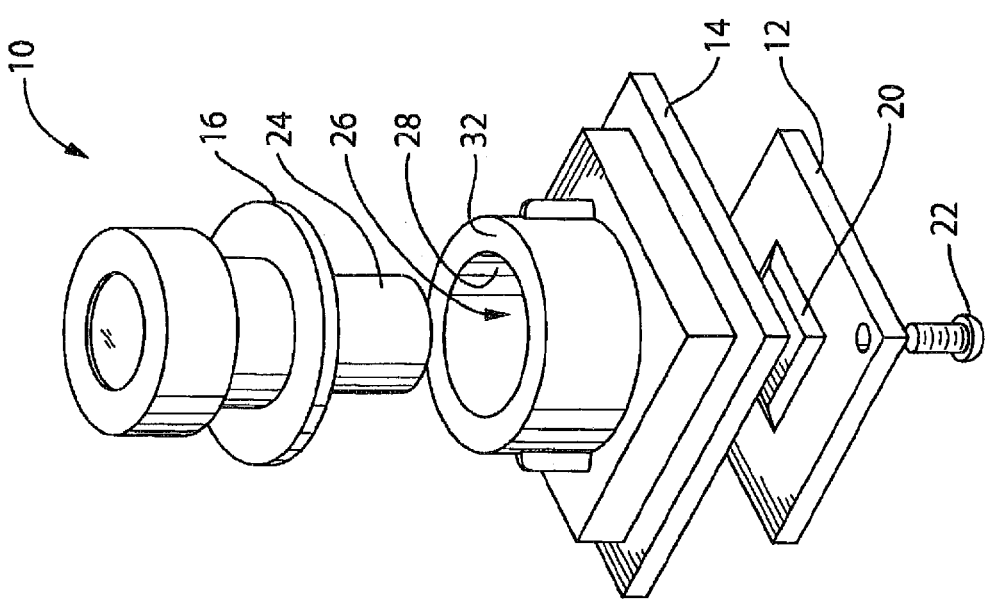
FIG. 1 is an exploded perspective view of a vehicular camera in accordance with an first embodiment of the invention wherein a lens barrel is adhesively secured to a lens holder via a UV-curable adhesive.

FIG. 1 shows an exploded view of a vehicular camera 10 in accordance with a first embodiment of the invention. The vehicular camera 10 includes an imager 20, a lens holder such as a front camera housing 14 and a lens 16. The vehicular camera 10 may include other components such as additional circuitry for processing the video input received by the imager 20, e.g., circuitry for providing graphic overlay to the video input. The vehicular camera 10 may further be configured to transmit the video input to other vehicular devices, such as a display controller (not shown) for a cabin-mounted display (also not shown).

The imager 20 may be a charge-coupled device (CCD) or a complementary metal-oxide semiconductor (CMOS) sensor. Referring additionally to FIG. 2, the imager 20 is mounted to a printed circuit board (PCB) 12. The imager 20 is positioned to receive optical images from the lens 16. In the exemplary embodiment shown in FIG. 1, the imager 20 is connected to the lens holder 14 by a plurality of threaded fasteners 22.

The lens 16 is mounted to the lens holder/front camera housing 14 at a selected position for focusing video input onto the sensing surface of the imager 20. The lens 16 may be any suitable type of lens known in the art. The lens 16 may have an exterior surface 24 that is configured to be received in a cylindrical aperture 26 having an aperture wall 28 on the lens holder/front camera housing 14. The exterior surface 24 and the aperture wall 28 may have a selected amount of clearance therebetween, shown by a gap G. An adhesive 30 is provided for holding the lens 12 in a specific position relative to the lens holder/front camera housing 14. More particularly, the adhesive 30 may be applied between a first axial face 32 on the lens holder/front camera housing 14, and a second axial face 34 on the lens 16.

The position of the lens 16 relative to the imager 20 impacts the degree of focus present in the optical images received by the imager 20 and thus the performance of the camera 10 and the optical alignment of the optical image on the imager.

To control the position of the lens 16 relative to the imager, a positioning system may be provided that includes a robot, such as a five axis robot or a six axis robot as discussed above. Such a robot is operable to grab and move objects (such as the lens or lens assembly or the imager and imager circuit board) in up to six axes of motion, such as along three generally orthogonal translational axes, such as along either of the x and y axes or directions (the axes generally parallel to the plane of the imager and generally orthogonal to the optical axis of the lens or lens assembly) and along the z-axis or direction (the axis that is generally orthogonal to the plane of the imager and generally along the optical axis of the lens or lens assembly). In addition to the translational movement capabilities of the robot, the robot is also operable to move or rotate or pivot the object and the grasping or holding portion or head of the robot about at least two axes and optionally three axes, so as to provide a pitch rotation or movement (rotation of the held object about one of the generally orthogonal axes generally parallel to the plane of the imager and generally orthogonal to the optical axis of the lens or lens assembly) and a yaw rotation or movement (rotation of the held object about the other of the generally orthogonal axes generally parallel to the plane of the imager and generally orthogonal to the optical axis of the lens or lens assembly), and optionally a roll rotation or movement (rotation of the held object about the axis generally orthogonal to the plane of the imager and generally along the optical axis of the lens or lens assembly). The robot holds and adjusts the position of the lens 16 relative to the lens holder/front camera housing 14 until a target object appears in suitable focus and at a suitable position on the imager 20, prior to hardening of the adhesive 30. The adjustment of the lens 16 relative to the lens holder/front camera housing 14 is facilitated by providing the selected amount of clearance between the exterior surface 24 of the lens 16 and the aperture wall 28 of the lens holder/front camera housing 14. Additionally, the thickness of the layer of adhesive 30 between the lens 16 and lens holder/front camera housing 14 may be selected to provide a suitable amount of relative angular adjustment between the lens 16 and lens holder/front camera housing 14. The thickness of the layer of adhesive may be approximately 0.75 mm prior to adjustment of the lens 16.

Once the lens 16 has been suitably positioned by the robot, the adhesive 30 is initially cured by exposure to UV light while the robot holds the lens 16 in position. The UV light may be provided from a plurality of UV sources about the periphery of the camera 10. The initial curing of the adhesive 30 may result in the adhesive being strong enough to hold the lens 16 in the lens holder/front camera housing 14 without needing the robot to grip the lens 16, and may take less than about 7 seconds. However, the lens 16 may be susceptible to movement if it incurs a relatively small disturbance at this stage. After the initial curing, the camera 10 may be placed by the robot relatively gently on a conveyor (not shown) and moved to a UV curing station for a further UV curing period, such as, for example, about 25 seconds. Another UV curing station may optionally be provided to further cure the adhesive 30 for another period, such as about 25 seconds, after the camera 10 leaves the first UV curing station. Subsequent to the UV curing, the camera 10 may be transferred to another curing station where the adhesive 30 can be thermally cured, or may be cured by exposure to some other secondary curing condition, to achieve its fully cured strength so that it can hold the lens 16 in position during use on a vehicle. The step of initially curing the adhesive 30 using UV light may be relatively instantaneous. This step of thermally curing the adhesive may take several minutes or hours. As an additional or alternative curing measure, the adhesive 30 may be moisture cured.

Providing an adhesive 30 that has an initial curability by UV light is advantageous in that the robot is not needed to hold the lens 16 in position over the period of time that it would take for the secondary curing condition to sufficiently harden the adhesive 30 to be self-supporting. Once the camera 10 is transferred from the robot to the curing fixture, the robot can be used for the positioning of another lens 16 in another lens holder 14/front camera housing. Because the task of positioning the lens 16 and initially curing the adhesive 30 using UV light can take less time than fully thermally curing of the adhesive 30, a single robot can feed cameras 10 with initially cured lenses to a plurality of curing fixtures, thereby providing the capability of achieving a relatively high rate of production per robot.

Once fully cured, the adhesive 30 may be capable of holding the lens 16 in position with at least a selected strength of bond between the lens 16 and lens holder/front camera housing 14 under one or more selected operating conditions. For example, the adhesive 30 may be capable of holding the lens 16 in position after a selected time period of 1000 hours of exposure to a selected temperature of 85 degrees Celsius and optionally a humidity of approximately 85 percent. Any of the aforementioned selected values may be selected to suit the particular environment that the camera 10 is expected to experience during use. The selected time period may, for example, be some other time period, such as approximately 1200 hours. The selected adhesive 30 may be further capable of holding the lens 16 in position after a selected time period exposed to a selected temperature of −40 degrees Celsius. The fully cured adhesive 30 may have other performance characteristics including: maintaining at least 70 percent of its strength (e.g. tensile strength) during exposure to temperatures ranging from −40 degrees Celsius to 95 degrees Celsius, having a tensile strength of at least 1000 psi, having a Shore D hardness value of at least 50, having a viscosity of between about 30000 and 70000 centipoise, being non-hygroscopic (so that it does not swell significantly when exposed to moisture), having a cure depth of at least 3 mm, having the capability to bond to Polybutylene Terephtalate/Polycarbonate and/or Polyphenylene Sulfide and/or liquid crystal polymer and/or anodized aluminum, having a bond shear strength of at least 1000 psi with less than a 60 percent reduction in its bond shear strength at 85 degrees Celsius, little or no outgassing, being capable of withstanding exposure to salt fog, being capable of withstanding typical automotive chemicals, such as gasoline and automotive cleaning agents, having a glass transition temperature that is at least 90 degrees Celsius and being 'automotive-grade' (i.e. being generally applicable for use in a vehicle).

The adhesive 30 may be applied by the robot itself prior to adjustment of the lens 16 relative to the lens holder/front camera housing 14. Alternatively, the adhesive 30 may be applied by some other device prior to (or during) possession of the camera 10 by the robot.

Aside from fixing the position of the lens 16 relative to the lens holder/front camera housing 14, the adhesive 30 may also hermetically seal the interior of the camera 10 against the outside environment.

Numerous adhesives were attempted for use as the adhesive 30. For example, it was found that some adhesives, such as some UV-cure free radical acrylates that have the capability of being initially cured using UV light, have a reduced strength (e.g. tensile strength) under exposure to elevated operating temperatures such as about 85 degrees Celsius over a selected period of time. It was further found that adhesives, such as some UV-curable free radical epoxy hybrids also have a reduced strength (e.g. tensile strength) under exposure to elevated operating temperatures such as about 85 degrees Celsius over a selected period of time. Some cationic epoxies that were tried also lost their strength when exposed to a temperature of about 85 degrees Celsius and a humidity of about 85 percent over a selected period of time. Some anionic cyanoacrylates that were tried were unsuitable as they produced too much outgas for optical use. Other adhesives, such as some UV-cure free radical silicones have a relatively low dimensional stability and are thus not suitable.

Surprisingly, it was found that a suitable adhesive that can be used for the adhesive is adhesive AD VE 43812 manufactured by Delo Industrial Adhesives of Windach, Germany. This adhesive is a low-temperature cure, epoxy-amine adhesive that can be cured initially relatively quickly by exposure UV light.

Figure 3:
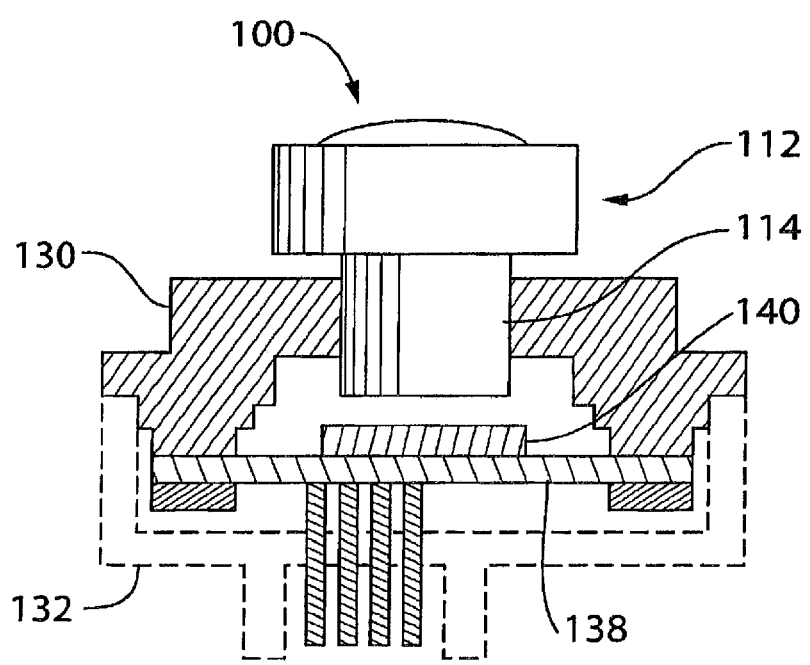
FIG. 3 is a schematic cross-sectional view of a variant of the first embodiment.
Figure 4:
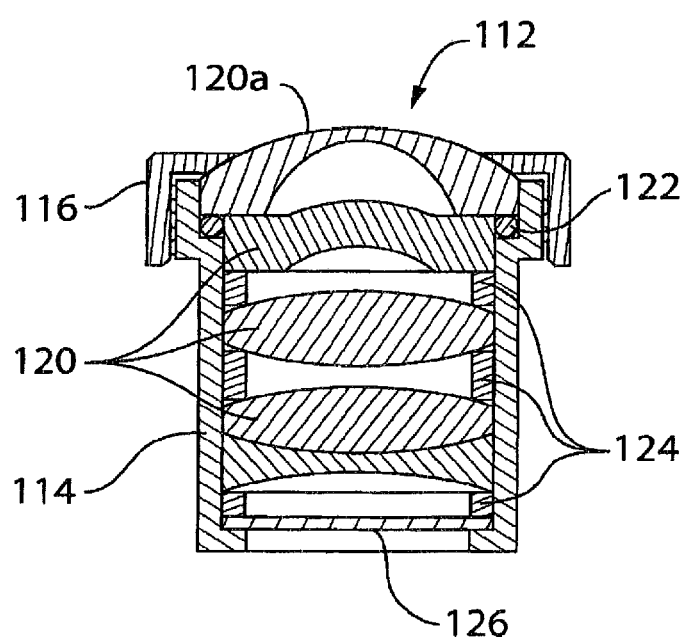
FIG. 4 is a cross-sectional view of a prior art lens.

FIG. 3 shows a variant 100 of the rear view camera 10. This embodiment incorporates a lens 112, a front housing/lens holder 130, a back housing 132 and an imager 140. As shown in greater detail in FIG. 4, the lens 112 includes a lens barrel 114 in which lens optical elements 120, O-ring 122, spacers 124 and IR cutoff filter 126 are mounted and held in place by a retainer cap 116. The front housing 130 holds the lens barrel 114 via a threaded connection, or an adhesive flange as discussed above. A printed circuit board (PCB) 138 with imager 140 is mounted in the housing defined by the front and back housing parts 130, 132. Screws 134 are used for this purpose. In order to mount the lens 112, it is first positioned in the housing 130, 132 by a robot or multi-axis focusing machine (which may provide six axes of motion or adjustment) so as to provide a focused image relative to the imager 140 and once properly aligned the lens 112 is thereafter fixedly attached to the front housing 130. The sealing between the lens 112 and front housing 130 is preferably provided by the adhesive discussed above, or by utilizing a thread lock device. Then, the back housing 132 is attached to the front housing 130 by laser or ultrasonic welding, adhesive, or via a press fitting.

Embodiment 2—Integration of Lens Barrel and Camera Lens Holder

Figure 5:
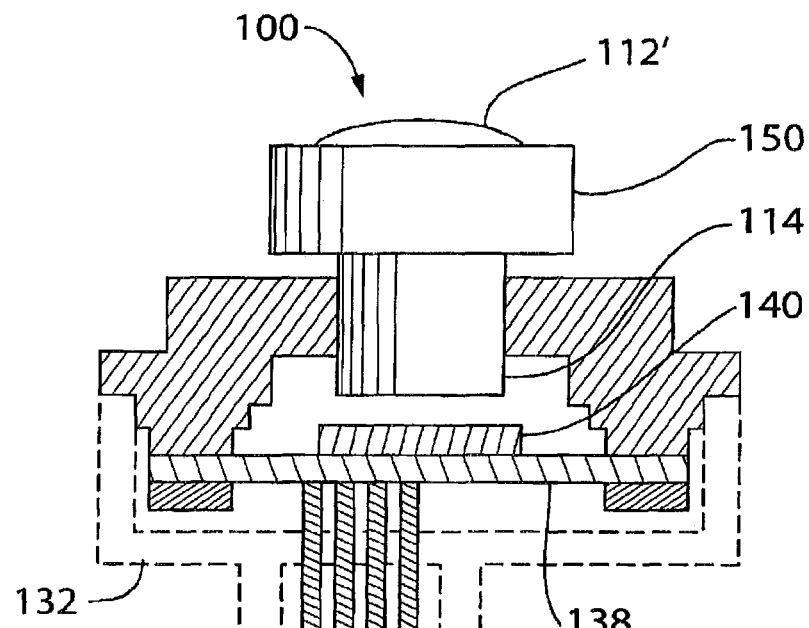
FIG. 5 is a schematic cross-sectional view of a second embodiment of the invention wherein a lens barrel is integrated with a camera lens holder.

FIG. 5 shows another embodiment 110 of a vehicular camera, wherein the lens barrel 114 housing the optical components of the lens 112 and the camera front housing 130 form a single integrated piece 150. The lens optical elements 120, O-rings and spacers 122, 124 and IR cutoff filter 126 (FIG. 4) are placed inside a lens barrel portion 114' of the integrated lens barrel and camera upper housing piece 150 as part of the conventional lens assembly process to provide a lens 112' (FIG. 5). The integrated piece 150 can be formed by plastic injection molding or metal machining. Plastic injection molding is preferred for lower cost and ease of attaching the back housing 132 to the integrated piece 150 by gluing, laser or ultrasonic welding.

The printed circuit board or PCB 138 with imager 140 is mounted to the integrated piece 110. Lens 112' is focused relative to the imager 140 such as by applying techniques described below with respect to embodiments 3 to 6.

The advantages of this embodiment 110 include a savings in tooling cost as one expensive upper housing plastic molding tool is eliminated; material cost savings since less plastic material is used and no expensive adhesive or thread lock epoxy is needed; and a more simplified camera assembly process since the step of attaching the lens to the upper housing is eliminated.

Embodiment 3—Lens Barrel Dropped on Surface of Imager

Figure 6:
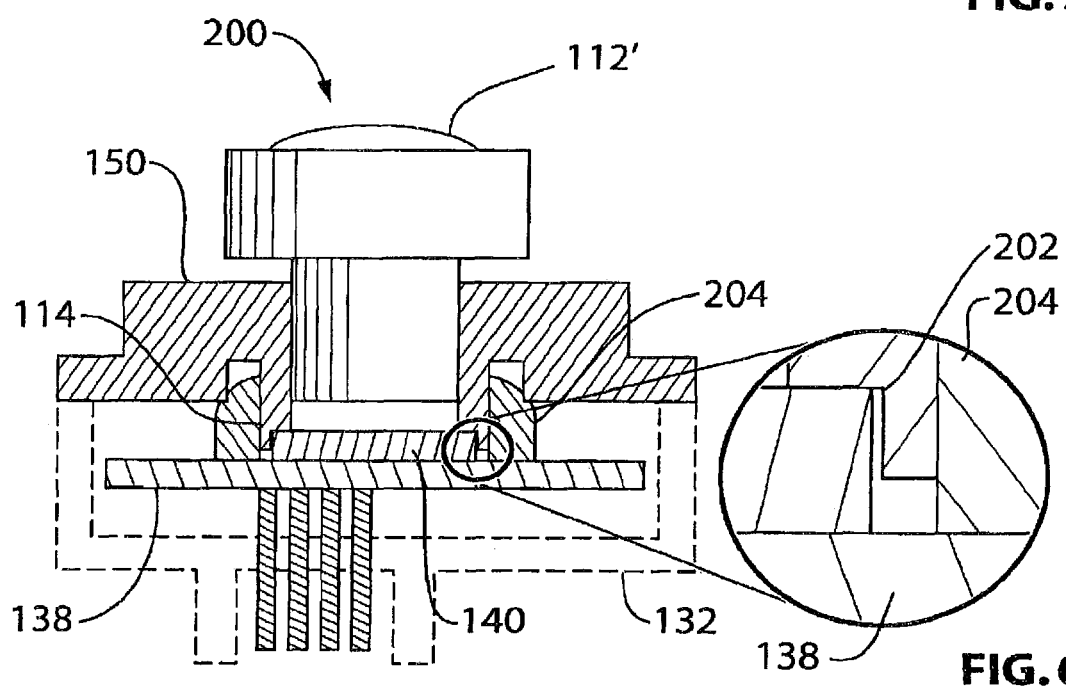
FIG. 6 is a schematic cross-sectional view of a third embodiment of the invention wherein a lens barrel is dropped on a surface of an imager.
Figure 7:
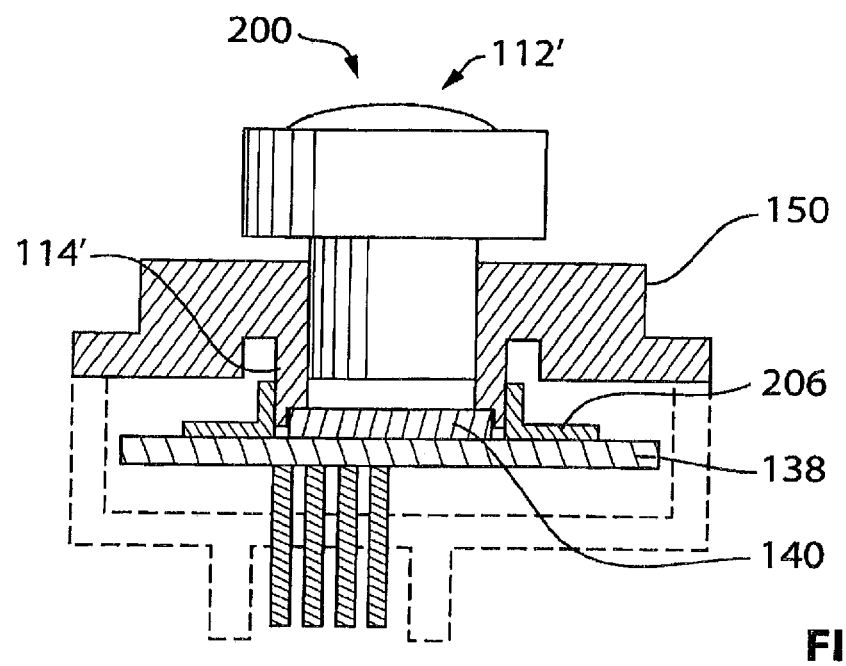
FIG. 7 is a schematic cross-sectional view of a variant of the third embodiment.

FIG. 6 shows another embodiment 200 of a vehicular camera wherein the lens barrel 114' of the integrated piece 150 is dropped onto and sits directly on top of the surface of the imager 140. During the camera assembly process, the lens barrel 114' is dropped directly onto the imager 140 as shown in FIG. 6. The lens barrel 114' includes a special designed mechanical feature such as rebate 202 (see detail view of FIG. 6) so that, while the lens barrel 114' is dropped to onto the imager 140, the rebate 202 guides the lens 112' to have proper horizontal alignment such that the lens optical axis is in line with the center of the imager sensing area (the alignment of optics axis to the center of the imager can also be achieved by digital shifting of image sensing window on imager. This digital center shifting feature can be found in some imagers, such as, for example, an Aptina MT9V126 CMOS imager).

As shown in FIG. 6, the lens 112' can be secured by applying adhesive 204 (such as UV-cured adhesive) around the interface of the lens barrel 114' with the imager 140 and PCB 138, thus fixing the lens focus position. In a variant 200' shown in FIG. 7, an alternative way to fix the lens 112' to the imager 140 is to include metal insert pins 206 in the lens barrel 114'. The metal insert 206 is then soldered to the PCB 138 during PCB reflow process to fix the lens 112' to the PCB 138.

Figure 8:
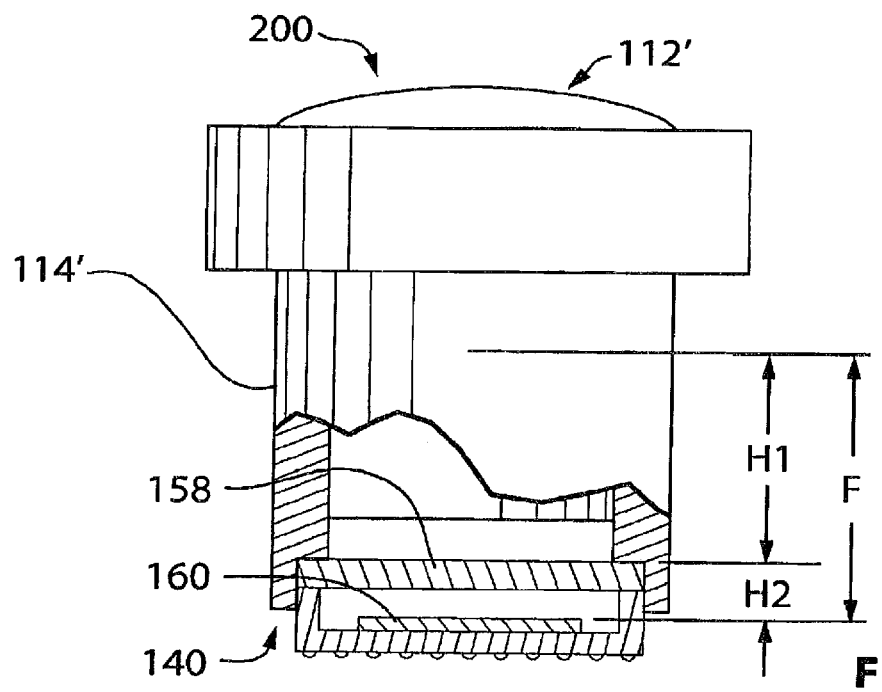
FIG. 8 is a detail cross-sectional view of the third embodiment.

As shown in FIG. 8, the distance from the lens principal plane LPP to the lens seating surface H1 (which is defined by a cover glass 158 that is spaced apart from imaging sensor surface 160), and the distance H2 between the imaging sensor surface 160 to the top surface of cover glass 158 need to satisfy the relation H1+H2=F+ΔF, where F is the effective focal length of the lens, and ΔF is the focus tolerance range.

ΔF multiplied by two (ΔF*2) is also called depth of focus, which can range from a few micrometers to hundreds of micrometers. For a typical automotive camera, the depth of focus is about 40 to 70 micrometers. H1 and H2 are the two sources that contribute to the variation of focus. The lens barrel 114' may be designed to have a tightly controlled length tolerance. The barrel length can be designed such that when it is dropped on the imager cover glass 158, the lens is focused right to the imager sensing surface 160 nominally. The imager 140 can also be designed such that the distance H2 between the sensing surface 160 and the top cover glass surface of the imager has a tight tolerance. However, the lenses and imagers manufactured will always have variations from their designed nominal values. The variation of H1 and H2 can stack up and drive the lens imager pair out of focus.

To control the focus tolerance and increase manufacturing yield, one or more of the following methods can be employed:

First, use optical technology such as wavefront coding as promoted by OmniVision. The technology uses specially designed lens elements and image processing algorithm to increase the depth of focus (ΔF) of the lens. The wider lens depth of focus allows more tolerate of focus position variation. The manufacturing yield and product focus quality can be maintained high.

Second, use a laser or other means to cut or ablate extra lens barrel material in the bottom of the lens barrel 114' so that the correct lens barrel length can be altered to achieve good focus. A pre-laser ablation focus measurement is performed to determine how much barrel material to ablate. To address the case that the lens being too short, one can design the lens barrel so that it is always in the longer side.

Third, bin and match lens 112' and imager 140 to achieve good drop-on focus. The idea is to measure and sort lenses and imagers. Bin the lenses and imagers to matching groups. For example, a lens group with Plus 20 to 30 micrometer too long of flange focal length is matched with an imager group with Minus 20 to 30 micrometer too short of silicon to top glass distance. The two groups will form a good focus camera.

It will thus be seen that by directly dropping the lens 112' to the image sensor 140, it is possible to avoid a time-consuming assembly step in the camera manufacturing process which requires actively searching for best focus position. It results in a reduced cycling time and increased production efficiency, and avoids the use of a very expensive multi-axis focus machine.

Embodiment 4—Lens Focus by PCB Mounting and Focusing Screws

Figure 9:
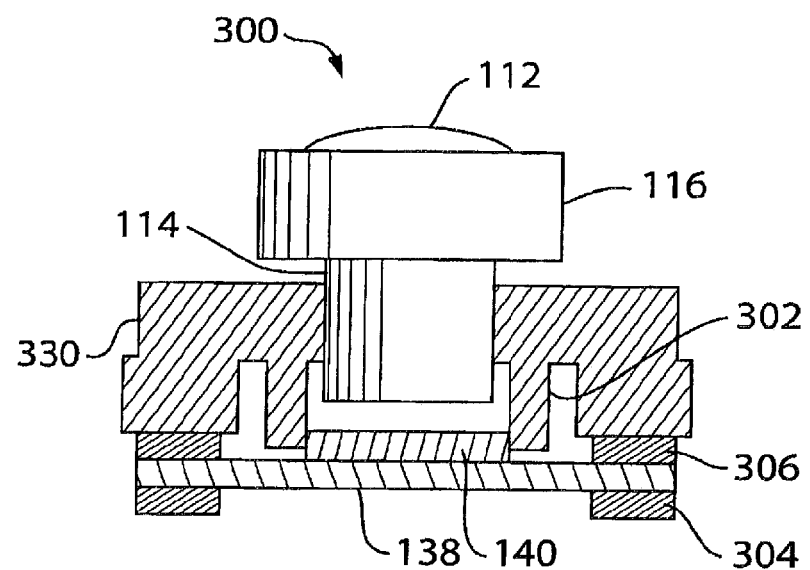
FIG. 9 a schematic cross-sectional view of a fourth embodiment of the invention wherein a lens is focused by PCB mounting screws.

FIG. 9 shows another embodiment 300 of a vehicular camera where a camera front housing 330 includes a mechanical guidance feature such as wall 302 for guiding the lens 112 to proper horizontal alignment with the imager 140 so that the lens optical axis is in line with the center of the imager sensing surface. In this embodiment, the PCB 138 with imager 140 is attached to the front housing 330 by screws 304 but also utilizing compressive gaskets, wave washers or lock washers 306 held between the PCB 138 and body of the front housing 330. The focusing between the lens 112 to imager 140 is accomplished by turning these screws 304 and actively monitoring camera output.

The alignment of the lens optical axis and imager center can be achieved by digitally shifting the image window on the imager.

Figure 10:
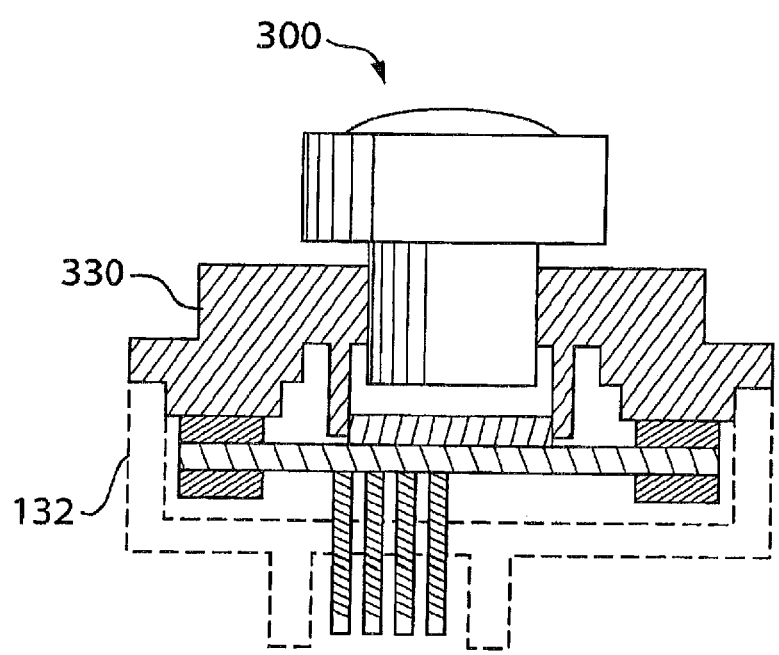
FIG. 10 is a schematic cross-sectional view of the fourth embodiment including a back housing.

Referring additionally to FIG. 10, the attachment of the camera back housing 132 to the front housing 330 (not drawn in this drawing) can be achieved by laser or ultrasonic welding, glue, press fitting, screw together or other means.

The camera front housing in this embodiment may also employ an integrated lens barrel as discussed above with respect to embodiment 110.

Embodiment 5—Lens Focused by Positioning of Camera Front and Back Housings

Figure 11:
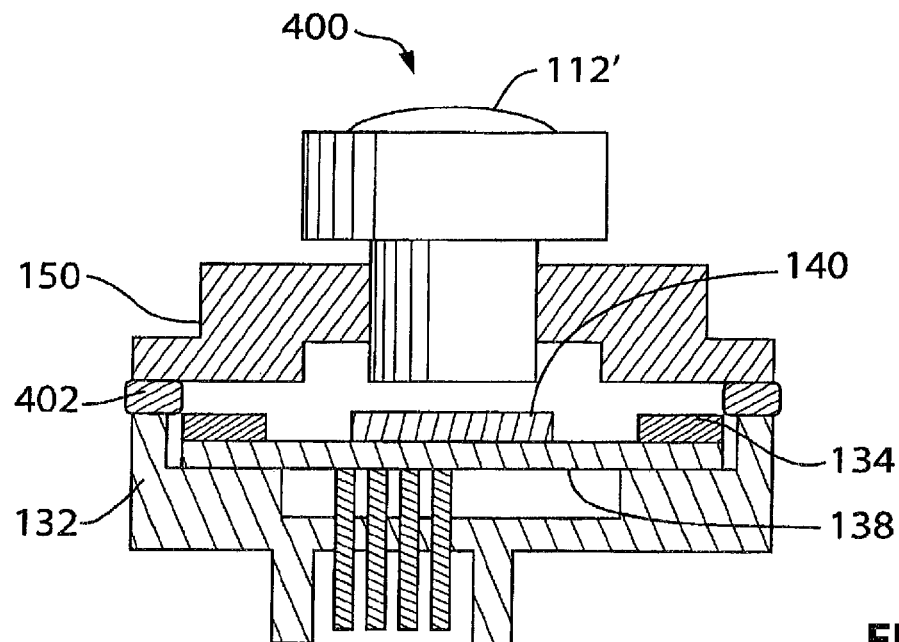
FIG. 11 is a schematic cross-sectional view of a fifth embodiment of the invention wherein a lens is focused by the selective positioning of camera front and back housings.

FIG. 11 shows another embodiment 400 of a vehicular camera in which the integrated lens barrel and camera upper housing piece 150 of embodiment 110 is attached to the camera back housing 132 by UV cured glue 402. The glue is applied before focus. An active focus and alignment (utilizing a multi-axis focusing machine) is performed to reach optimum lens focus and optical axis alignment to the imager center. While holding the integrated lens barrel and camera front housing piece 150 in the position achieving the best focus and alignment, a robot applies UV illumination to the adhesive to cure it and fix the position of the lens 112' and seal the camera. In this embodiment, the PCB 138 is mounted to back housing by screws 134, glue between PCB and back housing or other means.

Figure 12:
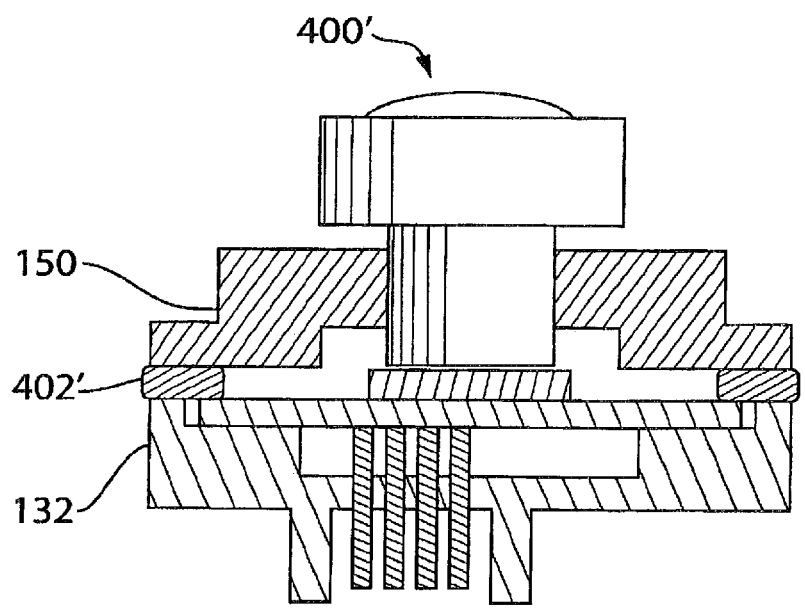
FIG. 12 is a schematic cross-sectional view of a variant of the fifth embodiment.

In a variant 400' shown in FIG. 12, the UV cured adhesive 402' also replaces the screws 134 used to mount the PCB 138 to the housing. The adhesive 402' thus attaches the PCB 132 to the back housing 138, fixes the integrated piece 150 to the back housing 132, and seals the camera.

Figure 13:
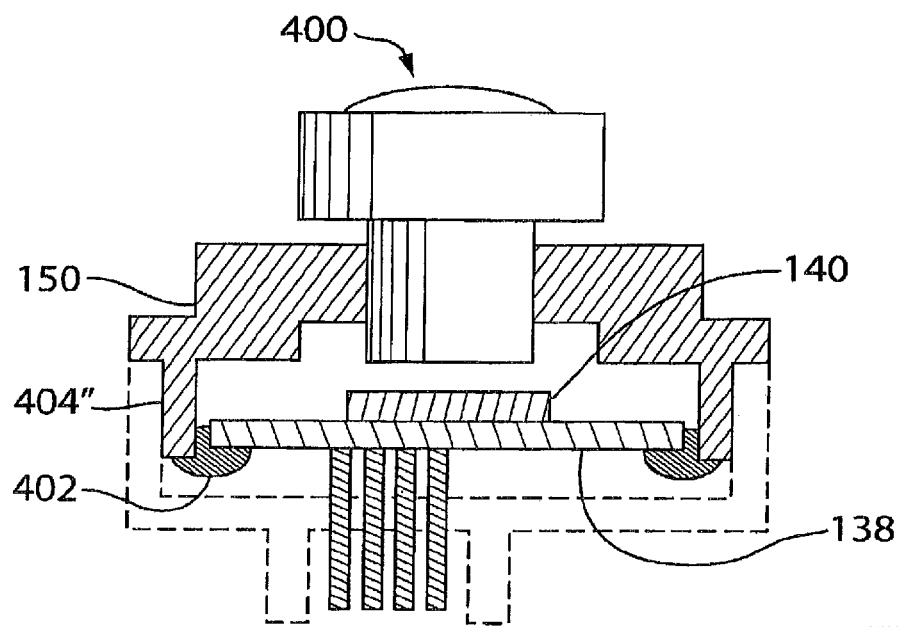
FIG. 13 is a schematic cross-sectional view of a variant of the fifth embodiment, wherein a PCB is selectively positioned.

In another variant 400" shown in FIG. 13, the imager PCB is focused and aligned and then fixed to the lens barrel and camera front housing piece 150 by UV cured adhesive 402" applied on and between the PCB 138 and standoff parts 404" of the integrated piece 150. During the focus assembly process, the imager PCB 138 is grabbed and moved in x, y and z direction(s), and optionally in two rotational directions, to achieve optimum focus and alignment. While the imager PCB 138 is being held in the position, UV illumination is applied to cure the adhesive 402".

Embodiment 6—Direct Attachment of Lens and Imager by Adhesive

Figure 14:
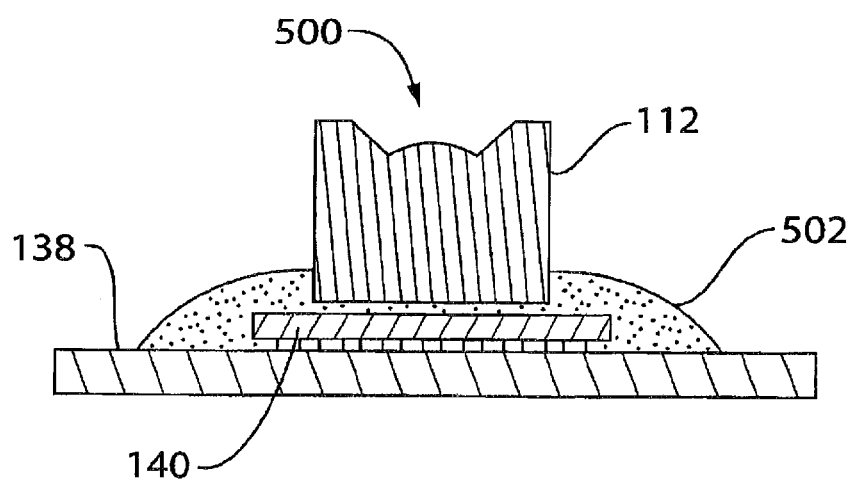
FIG. 14 is a schematic cross-sectional view of a sixth embodiment of the invention wherein a lens is focused by directly attaching a lens to an imager through a transparent adhesive.

FIG. 14 shows another embodiment 500 of a vehicular camera in which transparent UV-curable adhesive 502 is applied directly between lens 112 and imager 140 and/or PCB 138. The adhesive 502 is provided as a relatively large blob to bonds the lens 112 to the imager 140 and/or the PCB 138. The focus and alignment of the lens 112 is performed before UV light cures the adhesive. The adhesive preferably encapsulates the imager 140 and acts a protective shield for it.

In a preferred method of assembly, adhesive is applied on and around the imager in a controlled amount. A robot, such as a five-axis robot or the like (with motions in the x, y and z axes or directions and at least two orthogonal rotations and preferably a six-axis robot with translational motions in the x, y and z orthogonal axes and three orthogonal rotations), also grips and dips the lens into a batch of adhesive. The robot then focuses and aligns the lens to the imager (such as via adjustment of the lens and/or imager relative to one another via six degrees of freedom), whereupon UV light is applied to cure the adhesive. The robot then releases the lens.

This embodiment simplifies the lens barrel design and reduces the lens size. This embodiment can also be more advantageous than embodiments that utilize a threaded lens, which can be slow to focus or difficult to hold, or a press-fit lens, which provides only coarse movement and thus can be difficult to control. Thus, a more accurate alignment can be obtained.

In all of the foregoing embodiments it is also desired to reduce the cost of the lens itself. This can be accomplished in one or more of the following ways.

For example, plastic may be used for the lens barrel 114 and retainer cap 116. The barrel and cap are preferably made by injection molding of plastic material like PPS. This material is dense, nonporous, rigid and has ultra-low hygroscopic characteristics and thus it meets the special environmental and durability requirements for a rear view camera lens.

Optionally, for example, the lens 112' may be formed to incorporate only one glass element as the outer-most element 120a (FIG. 4) of the lens, and utilize two or three plastics lens (made by injection molding) for the inner optical elements. An alternative configuration may include two glass elements and one or two plastic lenses. Minimizing the number of glass elements reduces cost of the optical components.

In addition, cost savings may be realized by eliminating the lens IR cutoff filter 126 which is conventionally provided as a glass plate. Instead, the IR cutoff filter can be moved to the imager cover glass 120a. One added benefit of eliminating the IR cutoff filter in the lens is that it reduces or eliminate light multi-reflection between the flat IR cutoff filter and imager cover glass 120a. This multi-reflection can cause lens flare and ghost images.

Figure 15:
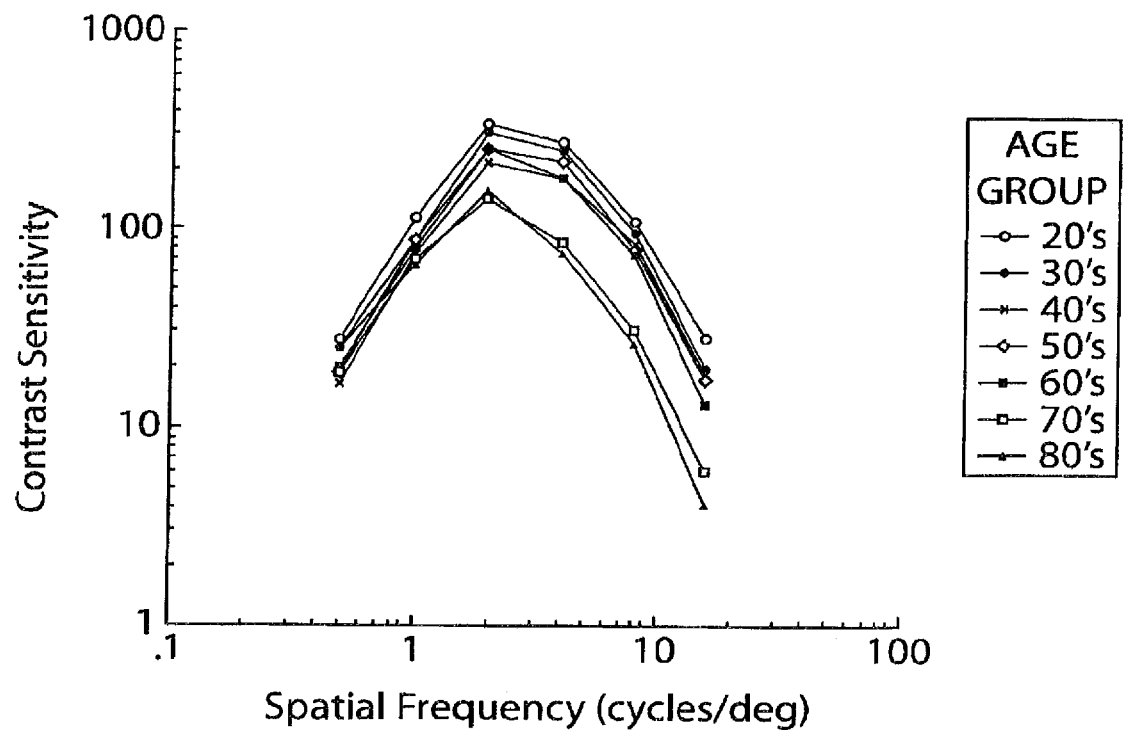
FIG. 15 is a graph of a contrast sensitivity function.
Figure 16:
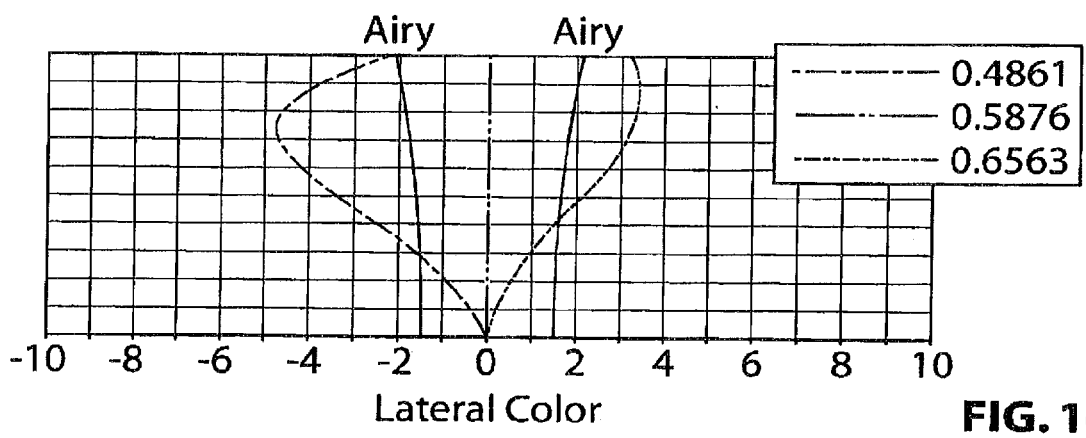
FIG. 16 is a graph of an example of lens chromatic aberration.
Figure 21:
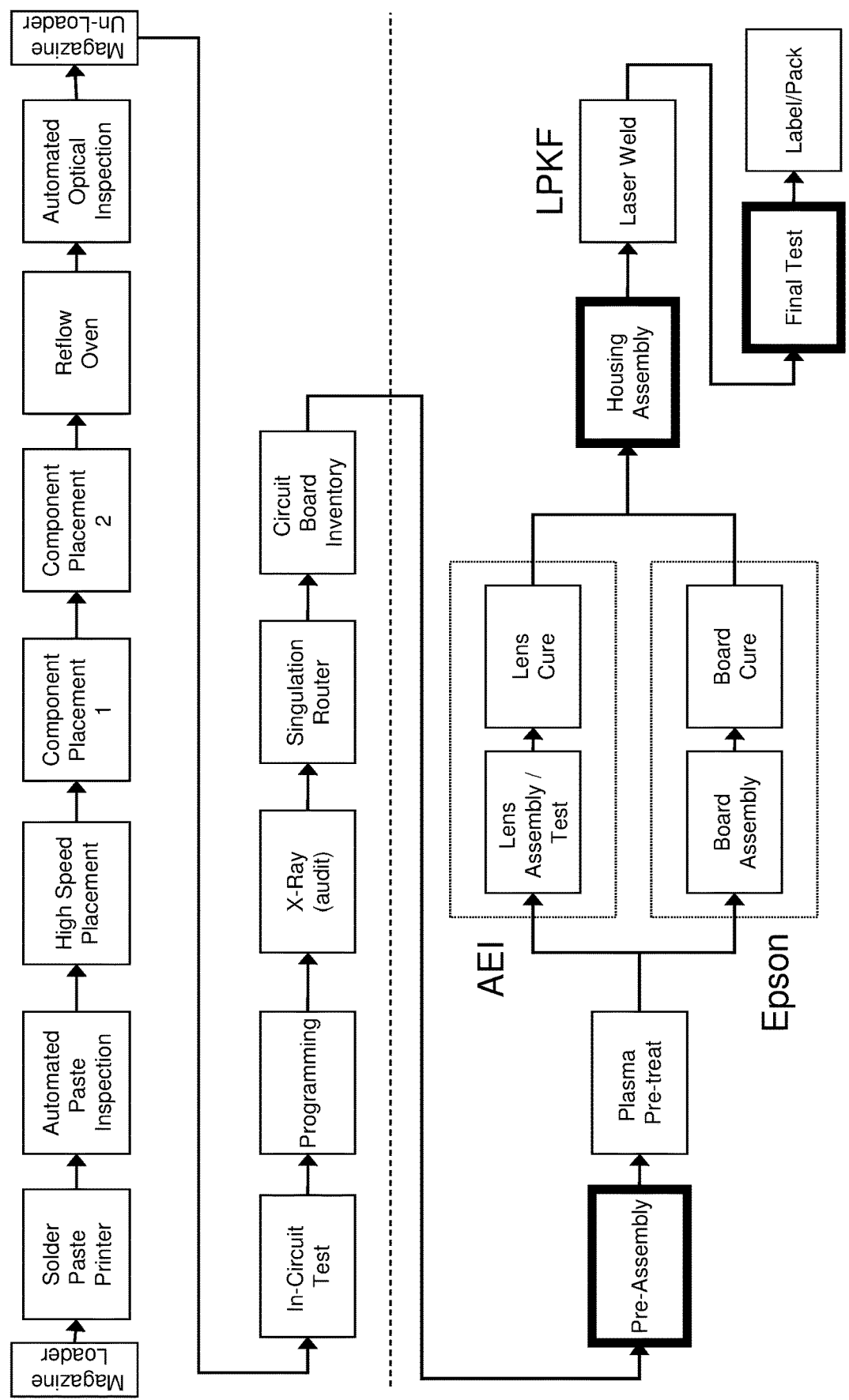
FIG. 21 is another block diagram of the assembly process for assembling the camera assembly of FIGS. 17 and 18.
Figure 22:
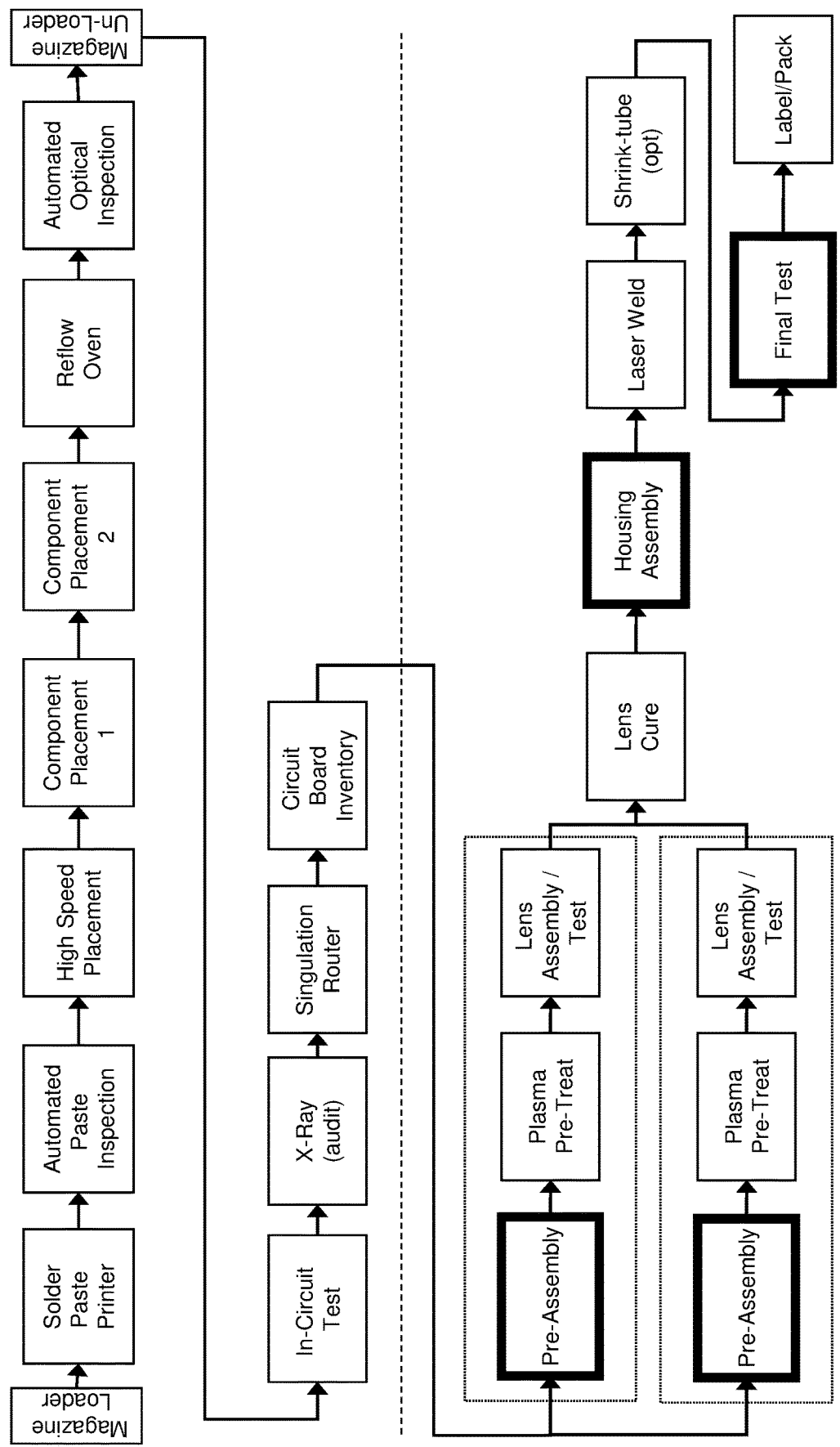
FIG. 22 is a block diagram of the assembly process for assembling the camera assembly of FIG. 19.

Optionally, for example, lens cost may also or otherwise be reduced by lowering the lens resolution. The lens resolution can be reduced to a level that fits the application requirement of the camera. More particularly, the human eye resolution perception can be represented by a contrast sensitivity function (CSF) as shown in FIG. 15. The CSF peaks within a range of 1 to eight cycles per degree, where a cycle is defined as a one transition from black to white (or vice versa), which may be referred to in the literature as a "line pair". Thus, a required resolution can be determined from the display size, the distance between the observer and the display, the selected CSF, and the size of the imager sensing surface.

For example, consider a 7-inch diagonal display (with a 16×9) aspect ratio. It has a horizontal dimension of 155 mm. Assume the distance between the observer and the display is 600 mm, which is the average distance between a driver's eyes and a display in the vehicle center console. Select a CSF of 7 cycles per degree, which is a reasonable compromise between machine vision and human vision requirements. And assume that the imager has a horizontal sensing width of 3.58 mm. One angular degree represents a width of 10.5 mm at distance of 600 mm. The display resolution required is 0.67 line pairs/mm. The required camera resolution is thus 28.9 line pairs per mm. Thus, a camera can produce a sufficient resolution is its lens yields a camera level modulation transfer function of 28.9 line pairs per mm.

Other examples of sufficient camera resolutions are provided in the chart below:

| | Display diagonal size (inch) | | | | |
| --- | --- | --- | --- | --- | --- |
| | 8 | 7 | 6 | 3.5 | 2.5 |
| Aspect Ratio | 16 × 9 | 16 × 9 | 16 × 9 | 4 × 3 | 4 × 3 |
| Horizontal Dimension (mm) | 177 | 155 | 133 | 71.1 | 50.8 |
| Eye to Display Distance (mm) | 600 | 600 | 600 | 500 | 500 |
| mm per 1 degree at Display | 10.5 | 10.5 | 10.5 | 8.7 | 8.7 |
| At display resolution (lp/mm) | 0.668 | 0.668 | 0.668 | 0.802 | 0.802 |
| Required camera resolution (lp/mm) | 33.0 | 28.9 | 24.8 | 15.9 | 11.4 |

Thus, lens resolution can be reduced to the limits dictated by the CSF in order to reduce cost. Prior art lenses may have too high resolution for human visual perception, and high resolution lenses can adversely cause a negative consequence called the "Moire Effect". Some of prior art camera designs utilized an optical low pass filter to lower the image sharpness of the lens to eliminate the "Moire Effect". The optical low pass filter adds cost to camera along with the higher cost high resolution lens.

Optionally, for example, lens cost may also or otherwise be reduced by not optically addressing any chromatic aberration in lens. Lens chromatic aberration can cause the resultant image to have color fringes at the edges of objects, as well as lower image resolution. Lens chromatic aberration can typically be fixed or mitigated by a pair of glass lens cemented together, the so-called achromat pair. However, for a low cost lens solution, the chromatic aberration is not fixed in the lens, rather, the imager system-on-chip (SOC) or an adjunct digital processor applies digital correction to correct the chromatic aberration. The chromatic aberration typically has fixed amount of spatial separation among different colors at a specific off-axis angle, as shown in the lateral color diagram example of FIG. 16.

The basic principle of digital correction of chromatic aberration is as follows.

Every pixel of an imager has individual values of red, green and blue colors. By shifting one pixel colors to one or more other pixels, and repeat the process to the whole imager, it is possible to correct or reduce the effect of lens chromatic aberration. Based on the lateral color separation of the lens, like the example graph shown in FIG. 16, the separation of the color as a function of the distance from the center of the imager is known. For each imager pixel, it is possible to calculate the distance needed to shift every individual colors of the pixel. The shift happens in a radial direction because of the lens' symmetry to its axis. In each pixel, new position coordinates of each color is re-calculated. Then this color value will be sent to the new pixel whose coordinates were calculated. The other two colors of this pixel are also calculated and sent to new pixels.

This shifting or redistribution of the pixel colors can be performed in System-On-Chip (SOC) part of imager, or a separate processor after the imager. The processor can be a microprocessor, a DSP, or a FPGA or other digital devices. Adding some gates or logical units to an existing digital processing unit most likely is less expensive than adding achromat glass elements in lenses. The lens chromatic aberration is typically symmetric over the optical axis, which lowers the complexity of digital chromatic aberration in the SOC or processor.

Lens manufacturing variation may cause the chromatic aberration to not be totally cylindrically symmetric. The spectral response of every imager pixel may thus have variations. To correct the negative effect to digital chromatic aberration caused by these two variations, one can apply calibration procedures. During a calibration procedure, a special target, an image acquisition and image processing algorithms are used to calculate lateral color separation at every pixel. Then the pixel related lateral color values are used in digital chromatic aberration correction process described above.

Use of Robot to Adhere PCB to Lens Assembly

Referring now to FIGS. 17 and 18, a vehicular camera 610 includes a lens assembly 614 and a circuit element 620 (such as a printed circuit board or the like) and a housing portion 612. Circuit element 620 comprises an imaging sensor, such as a VGA or megapixel imaging array, preferably a CMOS imaging array, such as an imaging array utilizing aspects of the imaging arrays described in U.S. Pat. Nos. 6,396,397; 5,877,897; 5,796,094; 5,670,935 and/or 5,550,677, which are hereby incorporated herein by reference in their entireties. Lens assembly 614 comprises a base portion 614a and a barrel portion 614b with lens optics (typically a plurality of individual glass and/or plastic lens elements that provide a wide angle and preferably a distortion corrected wide angle field of view for the vehicular camera) disposed therein. The lens assembly 614 may be provided as a pre-assembled element or construction. The circuit element 612 comprises a substrate 612a (such as a semiconductor substrate or a printed circuit board substrate or the like) with circuitry 612b established thereat or thereon, including an imaging array and associated circuitry. The circuit element 612 is adhered to the base portion 614a of the lens assembly 614 via curing of a plurality of adhesive beads or bead segments or dots 630 dispensed at or around or between the base portion 614a and circuit element 612, as discussed below. A rear housing or housing portion 632 is attached to the base portion 614a to substantially encase and seal (from the likes of water intrusion and/or intrusion by contaminants such as dirt, debris and the like) the circuit element 612 within and between housing portion 632 and lens assembly 614, as also discussed below.

The adhesive dots or beads or bead segments 630 may comprise any suitable adhesive, preferably an adhesive that may be initially partially cured via exposure to ultraviolet (UV) light for a short period of time (and optionally partially cured via a sequence of UV light exposure curing processes), and then later fully cured to its final cure state via a secondary curing process or a sequence of secondary curing processes, such as via exposure to elevated temperature for a period of time, such as an adhesive of the types discussed above. Although shown and described as having the adhesive beads or bead segments or dots dispensed at the fixtured base portion of the lens assembly, clearly, the adhesive beads or bead segments or dots may optionally be dispensed at the circuit element and/or the circuit element may be fixtured and the lens assembly may be moved or placed at the fixtured circuit element by a robot (such as a six axis robot or the like, such as discussed above), while remaining within the spirit and scope of the present invention.

The assembly process of the present invention includes placing the lens assembly 614 in a fixture and dispensing the adhesive dots 630 around a portion of the base portion 614a of the lens assembly. The adhesive dots or beads or bead segments are preferably dispensed at an inside surface of the base portion of the lens assembly (a surface that will be within the camera when the camera is fully assembled), and thus the adhesive need not be established or dispensed as a continuous or unbroken bead so as to create or establish a seal to the outside environment, and thus less adhesive can be used to adhere the circuit element (and imaging array) relative to the lens assembly (as compared to the embodiments similar to those discussed above where a continuous bead of adhesive is dispensed about an interface between the lens and the housing portion).

A robot or robotic device (such as a six axis robot as discussed above that is operable to grab and move objects in up to six axes of motion, such as three generally orthogonal translational axes (in the x, y and z directions) and up to three generally orthogonal rotational axes (a pitch axis, a yaw axis and a roll axis)) or the like may pick up the circuit element 620 and position the circuit element at the base portion 614a and place the circuit element on or at the adhesive dots 630. Such a robot is operable to grab the imager circuit element and move the imager circuit element in up to six axes of motion, such as along three generally orthogonal translational axes, such as along either or both of the x and y axes or directions (the generally orthogonal axes that are generally parallel to the plane of the base portion of the lens assembly and generally orthogonal to the optical axis of the lens or lens assembly) and along the z-axis or direction (the axis that is generally orthogonal to the plane of the base portion of the lens assembly and generally along the optical axis of the lens or lens assembly). In addition to the translational movement capabilities of the robot, the robot is also operable to move or rotate or pivot the circuit element and the grasping or holding portion or head of the robot about three generally orthogonal rotational axes, so as to provide a pitch rotation or movement (rotation of the held circuit element about one of the generally orthogonal axes that are generally parallel to the plane of the base portion of the lens assembly and generally orthogonal to the optical axis of the lens or lens assembly), a yaw rotation or movement (rotation of the held circuit element about the other of the generally orthogonal axes that are generally parallel to the plane of the base portion of the lens assembly and generally orthogonal to the optical axis of the lens or lens assembly) and a roll rotation or movement (rotation of the held circuit element about the axis generally orthogonal to the plane of the base portion of the lens assembly and generally along the optical axis of the lens or lens assembly).

When the robot has positioned the circuit element on or at the adhesive dots 630 at the base portion of the lens assembly (such as with the circuit element pressed partially against or contacting the adhesive beads or dots), the assembly process or system sets or positions or adjusts the circuit element relative to the base portion (with the adhesive dots being flexible or resilient in its uncured state to allow for adjustment or movement of the circuit element when the circuit element is engaged with or set at or on the adhesive dots) to precisely set or align the optic elements with the imaging array of the circuit element (such as by aligning the optical elements with the imaging array in x, y and z axes and pitch, yaw and roll or rotation). This is preferably done automatically by powering up the camera 610 and comparing an actual image captured to that of a standard calibration image. The five or six axis robot thus manipulates or moves the gripped circuit element 620 in three dimensional space (relative to the fixtured lens assembly) and with multiple axes of freedom until the automatic calibration determines that the focus and/or other alignment of the lens relative to the imaging array is correct or within a threshold tolerance.

When it is determined that the imaging array and optic elements are precisely aligned so that the optics properly focus images onto the imaging plane of the imaging array, the adhesive dots may be initially or partially cured via relatively brief exposure to UV light (such as for a duration of about seven seconds or thereabouts) to set the imaging array relative to the optic elements at the desired or appropriate alignment. The now joined circuit element and lens assembly may then index or move to a further partial curing stage that is a longer time duration than the initial brief exposure. The robot then can proceed to pick up another circuit element for positioning at or relative to another lens assembly, and thus, the utilization of expensive capital items, such as the robot itself, is enhanced or optimized. For example, the first UV cure duration or UV exposure may be less than about 10 seconds in duration, preferably less than about 7 seconds and typically greater than about 3 seconds, such as in a range of about 5 to 7 seconds or thereabouts. The further or second UV cure duration or UV exposure may be less than about 35 seconds, preferably less than about 20 seconds and greater than about 10 seconds, such as in a range of about 15 to 20 seconds or thereabouts. Thus, the robot is utilized to join the circuit element at the lens assembly and to align the lens optics with the imaging array and hold them in alignment during a relatively brief UV exposure, after which the joined circuit element and lens assembly may be moved or conveyed from the robotic station to a second or further UV exposure to further cure the adhesive (and during which time the robot may be used to assemble and align another circuit/lens subassembly) so that the parts are substantially joined for movement to a secondary curing station remote from the robotic station.

After the adhesive dots have been initially or partially cured (preferably after an initial shorter duration UV exposure immediately followed by another longer duration UV exposure), the lens assembly and circuit board construction (now substantially joined via the partially cured adhesive) can be moved to a secondary curing station (remote from or separate from the robotic station at which the circuit board is adhered to the lens assembly) to fully cure the adhesive dots to their final or fully cured state (such as via thermal curing). For example, the secondary curing station (or final curing station) may comprise an oven or heat chamber, where the lens assembly and circuit board construction may be heated to an elevated temperature (such as, for example, about 95 degrees C. or thereabouts) for a sufficient amount of time (such as, for example, about five minutes or thereabouts) to fully cure the adhesive (and optionally providing a cool down time following the heating of the adhesive and lens assembly and circuit board construction). Plainly, the oven can accommodate multiple cameras or may have a conveyor or lehr that moves the cameras through the oven so that each camera is in the oven and being heated by the oven for the predetermined or selected period of time.

In the illustrated embodiment of FIGS. 17 and 18, the lens assembly 614 is provided as a pre-assembled construction, with the lens barrel and base portion unitarily formed or pre-assembled with the lens optics in the barrel portion. Thus, the unibody lens assembly may be fixtured or fixedly supported for attachment or adhering of the circuit board to the base portion of the lens assembly. Optionally, and as shown in FIG. 19, a lens assembly 614' may comprise a separate base portion 614a' and barrel portion 614b', where an initial step of the assembly process may comprise adhering the barrel portion to the base portion to construct the lens assembly. The other components of the camera 610' shown in FIG. 19 may be similar to the components of camera 610 of FIG. 18, such that a detailed discussion of the common or similar components need not be repeated herein.

After the circuit element 612 is adhered to the lens assembly 614 and the adhesive is cured, the housing portion 632 is attached to and sealed to the base portion 614a of lens assembly 614, such as via laser welding or the like. For example, the housing portion may be sealed/attached at the base portion by utilizing aspects of the camera assemblies described in U.S. Pat. No. 7,965,336, and/or U.S. patent application Ser. No. 12/091,359, filed Apr. 24, 2008 and published Oct. 1, 2009 as U.S. Publication No. US-2009-0244361, which are hereby incorporated herein by reference in their entireties. The housing portion and base portion of the lens assembly thus encase the circuit board or element therein or therebetween to provide a water tight or substantially water impervious housing or encasement for the circuit element and imaging array and circuitry. In the illustrated embodiment, the circuit element includes electrically conductive terminals or leads 612c that are electrically connected to circuitry 612b and that protrude from the circuit substrate or board 612a and are received in a connector portion 632a of housing portion 632 when the housing 632 is attached to the base portion 614a of lens assembly 614. The terminals 612c thus are received in an electrical connector to provide a multi-pin connector for electrically connecting the camera 610 to a wiring harness of a vehicle when the camera is installed or mounted at the vehicle.

Thus, the present invention provides an assembly process for assembling a vehicular camera that adheres a circuit board to a base portion of a lens assembly to align and affix the imaging array of the circuit board relative to the lens optics of the lens assembly. With reference to FIG. 20, the process 650 may include loading of an integrated lens holder or lens assembly into a holding fixture at 652. The fixture may include locating features or elements that allow the lens assembly or lens holder to be properly positioned for each camera and to be biased to the component's pre-determined datums. Optionally, pallet tracking software (such as RFID tracking software or the like) may be used to track each assembly pallet as it transfers from station to station during the process. The lens assembly may be picked and placed at the fixture via a robotic device or suitable automated or manual process, such as via a three-axis module. The base portion may be plasma-treated and the adhesive dots or beads or bead segments may be dispensed at the base portion of the lens assembly at 654. The plasma-treating process may be accomplished via any suitable means. The adhesive beads or dots may be dispensed via any suitable dispenser, such as via a servo dispenser head or the like, and the dispensing may be monitored by a vision system (such as a Cognex micro 1050 vision camera or the like) to verify that the appropriate amount of adhesive was dispensed at the proper locations. The servo dispense head (such as a Viscotech dispense head or the like) may be mounted to a robot.

The circuit element may be automatically picked from a tray/stacker and placed at or on the dispensed adhesive dots at 656, whereby the system may perform the x, y and z (and pitch, yaw and roll or rotation) focus of the lens relative to the imaging array. A robot may be used to place the circuit board at the adhesive dots and adjust the circuit element and imaging array to achieve the desired or appropriate focus. After the focus level is achieved, the system may flash UV cure the adhesive dots, such as via a flash UV cure system, such as a Lesco, Super Spot "Max" system or the like (for a brief UV exposure duration, such as less than about 10 seconds or thereabouts), and the system may subsequently further UV cure the adhesive via a second or subsequent or further UV cure system (for a longer UV exposure duration, such as greater than about 10 seconds and less than about 35 seconds or thereabouts). The further UV curing station may be along the same conveyor line and adjacent to the robotic station so that the lens and circuit element construction is not substantially moved until after it has undergone the further UV cure/exposure. The lens and circuit element construction (with the lens assembly and circuit element joined by the partially cured adhesive) is moved to a secondary cure system or station at 658 (such as a thermal curing station or the like that may be remote from the robotic station and UV curing station) where the adhesive is further cured to a substantially cured state. The housing portion may be attached to the base portion to encase and/or seal the circuit element and imaging array therein and/or the camera sub-assembly or construction may be offloaded at 660. Optionally, and with reference to FIG. 21, other steps or processes may be included in the camera construction process, while remaining within the spirit and scope of the present invention. Optionally, and with reference to FIG. 22, other steps or processes may be included in the camera construction process where the lens assembly is provided as a two piece construction, such as the construction shown in FIG. 19, while remaining within the spirit and scope of the present invention.

The system or method of the present invention moves the circuit board and imaging array to the optical center of the lens and thus results in positive x-axis and y-axis positioning for vehicle packaging. The front end pallet or fixture design may continue to datum off "A" surface but will not require electrical connection, and the circuitry of the circuit element or PCB may be electrically engaged at the align and focus stage or station. The system thus may reduce false failures that may occur due to pallet connections. Also, there is no requirement of articulation of the lens for the plasma treat process. The system also provides for a reduction of unscheduled down time for gripper repair and replacement.

The six axis robot and alignment system of the present invention thus may properly position and align and adhere the lens or optics relative to the imager and may properly position and align and adhere the imager relative to the camera body. Optionally, the lens and camera body portion may be provided as a pre-assembled unit (such as shown in FIGS. 17 and 18) or may be assembled together before attachment of the imager and circuit element thereat, whereby the imager and circuit element or circuit board are placed at and adhered at the camera body portion via a six axis robot such as discussed above. For example, the imager and circuit element or printed circuit board may be picked up by the robot and positioned and aligned at the camera body portion to properly orient the imager relative to the camera body. For example, the circuit element may be moved via the robot along all three translational axes (x, y and z axes) to position the circuit element (and imager established thereat) generally at the camera body portion, and the robot may tilt or pivot or rotate the circuit element about the x and y axes and may pivot or rotate or roll the circuit element about the z-axis to properly align and orient the imager at the lens optics and at the camera body portion. When the circuit element is at the appropriate location and alignment and orientation, the circuit element is adhered to the camera body portion (such as via the two stage curing of the adhesive as discussed above).

The ability of the robot to adjust the circuit element and imager about the z-axis ensures proper alignment of the imager relative to the camera body portion, such that, when the camera body is fully assembled and sealed (i.e., after the back portion of the camera body is attached and sealed at the front camera body portion and lens assembly) and mounted at a vehicle (via use of datums at the camera body, such as at the front camera body portion, that align with or engage datums at the vehicle mounting structure to precisely position the camera body at the vehicle), the imager is properly and precisely oriented not only relative to the camera body but also relative to the vehicle at which the camera is mounted. Thus, the six axis robot of the present invention precisely aligns and orients the imager relative to the lens optics and relative to the camera body, so that images captured by the camera when the camera is mounted on a vehicle are properly focused and properly oriented relative to the vehicle and relative to the horizon and vehicle bumper (such as for a rearward facing camera at a rear portion of the vehicle).

The process of placing and gluing the circuit element at the lens assembly and/or camera body or body portion utilizes an adhesive that allows for a dual curing process or dual stage cure, where an initial cure may be quickly achieved via UV exposure and a final cure may be later achieved via a low temperature thermal cure. For example, the type or form of adhesive is referred to as an epoxy-amine adhesive. It is unique because it has a dual cure mechanism that allows it to be quickly cured via UV light exposure and then further or completely cured to a very high strength via heat exposure or thermal cure. The required cure temperature for this adhesive is relatively low (such as in the range of about 85 degrees C. to about 95 degrees C.) as compared to other known adhesives or similar chemistries. This adhesive type is generically referred to as a Dual Bond adhesive commercially available from Delo Industrial Adhesives of Windach, Germany. The exact mix used in the above described embodiments is Delo's AD VE 43812, but clearly other adhesives having similar properties as described above may be utilized while remaining within the spirit and scope of the present invention. A key advantage for such an adhesive (having a quick UV cure step with a follow-up low temperature thermal cure step) is that it is ideal for high production or high volume camera assembly processes. The quick UV cure allows the system to quickly shuttle fixtured components out of high cost focus and alignment stations to lower cost thermal cure stations, such that the time spent by the assembly at the high cost stations is minimized.

Thus, the present invention provides an enhanced assembly process for assembling or manufacturing vehicular cameras or camera modules. The two stage curing process allows the system to quickly partially cure the adhesive that holds the circuit element and imaging array relative to the lens optics so that the circuit and lens sub-assembly may be moved from the robot station to a later or subsequent secondary curing station, while the robot may quickly be ready to pick and place and adhere and align another circuit element and imaging array with another fixtured lens assembly at the same time that the first circuit and lens sub-assembly is being further cured at a different station. The present invention thus provides for reduced time usage of the robotic device so that it can be used on subsequent cameras while the earlier cameras are fully cured at a separate curing station. The system may comprise a secondary UV curing station at or near the robotic station and optionally along a conveyor line that moves or conveys the parts from a fixturing station to the robotic station and initial UV curing station (where the components are joined and aligned and the adhesive is briefly exposed to UV light) to the further UV curing station (where the adhesive is again exposed to UV light, but for a longer period of time) and to an unloading or offloading station. Optionally, a secondary curing station may be provided to thermally cure the adhesive to its substantially final cure state (such as via an oven or the like), or optionally, the secondary curing station may comprise another type of curing station, while remaining within the spirit and scope of the present invention (with the secondary curing station optionally being remote from the robotic station and UV curing stations).

While the above describes particular embodiment(s) of the invention, it will be appreciated that modifications and variations may be made to the detailed embodiment(s) described herein without departing from the spirit of the invention.

The invention claimed is:

1. A camera sub-assembly for a vehicular camera, the camera sub-assembly comprising:
   a lens barrel, wherein the lens barrel comprises (i) a cylinder having a length and a circular cross section, the cylinder commencing at a first end and terminating at a second end, the cylinder accommodating a plurality of lens optics, and (ii) an annular flange integral with and extending radially outward from the cylinder at a location between the first end and the second end of the cylinder of the lens barrel, the annular flange having an annular attaching surface at a side of the annular flange that is spaced from and faces toward the first end of the cylinder;
   a lens holder comprising (i) a cylindrical lens barrel receiving structure and (ii) an annular attaching surface at an outer end of the cylindrical lens barrel receiving structure;
   a printed circuit board having an imaging array disposed thereat;
   wherein the printed circuit board is attached at the lens holder;
   wherein the first end of the cylinder of the lens barrel is received in the cylindrical lens barrel receiving structure of the lens holder so that the annular attaching surface of the annular flange of the lens barrel is juxtaposed with the annular attaching surface at the outer end of the cylindrical lens barrel receiving structure of the lens holder with a cured adhesive disposed therebetween, the cured adhesive contacting both of (i) the annular attaching surface at the outer end of the cylindrical lens barrel receiving structure of the lens holder and (ii) the annular attaching surface of the annular flange of the lens barrel;
   wherein the cured adhesive comprises an adhesive material that is curable from an uncured state to a partially-cured state via exposure of the adhesive material to ultraviolet light, and wherein the adhesive material is further curable from the partially-cured state to a more-cured state;
   wherein, with the adhesive material in the uncured state and contacting both of (i) the annular attaching surface at the outer end of the cylindrical lens barrel receiving structure of the lens holder and (ii) the annular attaching surface of the annular flange of the lens barrel, the plurality of lens optics is alignable with respect to the imaging array of the printed circuit board attached at the lens holder;
   wherein, with the plurality of lens optics aligned with respect to the imaging array, the adhesive material is cured from the uncured state to the partially-cured state via exposure of the adhesive material to ultraviolet light;
   wherein, with the lens barrel and the lens holder joined together by the adhesive material in the partially-cured state, the joined lens barrel and lens holder construction is moved to a further curing station;
   wherein, with the joined lens barrel and lens holder construction at the further curing station, the adhesive material is further cured from the partially-cured state to the more-cured state; and
   wherein, with the adhesive material in the more-cured state, the cured adhesive maintains alignment of the plurality of lens optics with respect to the imaging array for use of the camera sub-assembly for the vehicular camera on a vehicle.

2. The camera sub-assembly of claim 1, wherein the plurality of lens optics is aligned with respect to the imaging array by bringing into focus at the imaging array image data captured using the plurality of lens optics.

3. The camera sub-assembly of claim 1, wherein the printed circuit board is mechanically attached at the lens holder.

4. The camera sub-assembly of claim 3, wherein the printed circuit board is mechanically attached at the lens holder via at least one threaded fastener.

5. The camera sub-assembly of claim 3, wherein the printed circuit board is mechanically attached at the lens holder via a plurality of fasteners.

6. The camera sub-assembly of claim 5, wherein the plurality of fasteners comprises a plurality of threaded fasteners.

7. The camera sub-assembly of claim 6, wherein the plurality of threaded fasteners comprises a plurality of screw fasteners.

8. The camera sub-assembly of claim 1, wherein the printed circuit board is attached at the lens holder using another cured adhesive.

9. The camera sub-assembly of claim 1, wherein the further curing station comprises a thermal curing station.

10. The camera sub-assembly of claim 9, wherein the thermal curing station comprises an oven.

11. The camera sub-assembly of claim 1, wherein the adhesive material is further cured from the partially-cured state to the more-cured state via heating the adhesive material to a temperature of at least 85 degrees C.

12. The camera sub-assembly of claim 11, wherein the adhesive material is further cured from the partially-cured state to the more-cured state via heating the adhesive material for at least ten seconds.

13. The camera sub-assembly of claim 1, wherein the further curing station comprises multiple curing fixtures.

14. The camera sub-assembly of claim 1, wherein the further curing station comprises a moisture cure station.

15. The camera sub-assembly of claim 1, wherein the adhesive material is cured from the uncured state to the partially-cured state via exposure of the adhesive material to ultraviolet light for a first time period, and wherein the adhesive material is further cured from the partially-cured state to the more-cured state via further curing the adhesive material for a second time period, and wherein the first time period for curing the adhesive material from the uncured state to the partially-cured state is less than the second time period for further curing the adhesive material from the partially-cured state to the more-cured state.

16. The camera sub-assembly of claim 15, wherein the first time period is less than ten seconds and the second time period is greater than ten seconds.

17. The camera sub-assembly of claim 16, wherein the first time period is greater than three seconds.

18. The camera sub-assembly of claim 17, wherein the first time period is less than seven seconds.

19. The camera sub-assembly of claim 1, wherein the adhesive material is cured from the uncured state to the partially-cured state via exposure of the adhesive material to ultraviolet light for less than ten seconds.

20. The camera sub-assembly of claim 19, wherein the adhesive material is cured from the uncured state to the partially-cured state via exposure of the adhesive material to ultraviolet light for less than seven seconds.

21. The camera sub-assembly of claim 19, wherein the adhesive material is cured from the uncured state to the partially-cured state via exposure of the adhesive material to ultraviolet light for greater than three seconds.

22. The camera sub-assembly of claim 21, wherein the adhesive material is cured from the uncured state to the partially-cured state via exposure of the adhesive material to ultraviolet light for five to seven seconds.

23. The camera sub-assembly of claim 19, wherein the adhesive material is further cured from the partially-cured state to the more-cured state via further exposure of the adhesive material to ultraviolet light.

24. The camera sub-assembly of claim 23, wherein the adhesive material is further cured from the partially-cured state to the more-cured state via further exposure of the adhesive material to ultraviolet light for a period of time that is greater than ten seconds.

25. The camera sub-assembly of claim 1, wherein the adhesive material comprises an epoxy-amine adhesive material.

26. The camera sub-assembly of claim 1, wherein, prior to the first end of the cylinder of the lens barrel being inserted into the cylindrical lens barrel receiving structure of the lens holder, the adhesive material is dispensed in the uncured state at one or both of (i) the annular attaching surface at the outer end of the cylindrical lens barrel receiving structure of the lens holder and (ii) the annular attaching surface of the annular flange of the lens barrel.

27. The camera sub-assembly of claim 26, wherein the adhesive material is dispensed as a plurality of spaced apart dots of the adhesive material in the uncured state at one or both of (i) the annular attaching surface at the outer end of the cylindrical lens barrel receiving structure of the lens holder and (ii) the annular attaching surface of the annular flange of the lens barrel.

28. The camera sub-assembly of claim 26, wherein the adhesive material is dispensed as a continuous bead of the adhesive material in the uncured state at one or both of (i) the annular attaching surface at the outer end of the cylindrical lens barrel receiving structure of the lens holder and (ii) the annular attaching surface of the annular flange of the lens barrel.

29. The camera sub-assembly of claim 26, wherein the dispensed adhesive material has a thickness, in the uncured state, of up to 0.75 mm prior to aligning the plurality of lens optics with respect to the imaging array.

30. The camera sub-assembly of claim 26, wherein the adhesive material is dispensed via a servo dispenser head.

31. The camera sub-assembly of claim 30, wherein the dispensing of the adhesive material is monitored via a vision system.

32. The camera sub-assembly of claim 26, wherein, prior to dispensing the adhesive material in the uncured state, one or both of (i) the annular attaching surface at the outer end of the cylindrical lens barrel receiving structure of the lens holder is plasma-treated and (ii) the annular attaching surface of the annular flange of the lens barrel is plasma-treated.

33. The camera sub-assembly of claim 1, wherein the lens holder is configured for attaching at a camera housing to encase the printed circuit board and the imaging array.

34. The camera sub-assembly of claim 1, wherein the plurality of lens optics is aligned with respect to the imaging array utilizing a multi-axis positioning device that is one selected from the group consisting of (i) operable to position the lens holder to align the plurality of lens optics with respect to the imaging array by (a) translating the lens holder relative to the lens barrel along one or more of x, y, z orthogonal translational axes and (b) manipulating the lens holder relative to the lens barrel about one or more of pitch, yaw and roll rotational axes, and (ii) operable to position the lens barrel to align the plurality of lens optics with respect to the imaging array by (a) translating the lens barrel relative to the lens holder along one or more of x, y, z orthogonal translational axes and (b) manipulating the lens barrel relative to the lens holder about one or more of pitch, yaw and roll rotational axes.

35. The camera sub-assembly of claim 34, wherein the multi-axis positioning device is operable to position the lens holder to align the plurality of lens optics with respect to the imaging array by (a) translating the lens holder relative to the lens barrel along one or more of x, y, z orthogonal translational axes and (b) manipulating the lens holder relative to the lens barrel about one or more of pitch, yaw and roll rotational axes.

36. The camera sub-assembly of claim 35, wherein the plurality of lens optics is aligned with respect to the imaging array via grasping, via the multi-axis positioning device, the lens holder and manipulating, via the multi-axis positioning device, the lens holder relative to the lens barrel.

37. The camera sub-assembly of claim 36, wherein, after the plurality of lens optics is aligned with respect to the imaging array and after the adhesive material is cured to the partially-cured state via exposure to ultraviolet light, the lens holder, with the lens barrel joined thereto by the adhesive material, is released by the multi-axis positioning device.

38. The camera sub-assembly of claim 34, wherein the multi-axis positioning device is operable to position the lens barrel to align the plurality of lens optics with respect to the imaging array by (a) translating the lens barrel relative to the lens holder along one or more of x, y, z orthogonal translational axes and (b) manipulating the lens barrel relative to the lens holder about one or more of pitch, yaw and roll rotational axes.

39. The camera sub-assembly of claim 34, wherein the multi-axis positioning device comprises a multi-axis robot.

40. The camera sub-assembly of claim 34, wherein the multi-axis positioning device comprises a five axis robot.

41. The camera sub-assembly of claim 34, wherein the multi-axis positioning device comprises a six axis robot.

42. The camera sub-assembly of claim 34, wherein the lens holder and the lens barrel joined together by the adhesive material in the partially-cured state is moved to the further curing station without utilizing the multi-axis positioning device.

43. The camera sub-assembly of claim 34, wherein the plurality of lens optics is aligned with respect to the imaging array by utilizing the multi-axis positioning device to align the plurality of lens optics with respect to the imaging array while using the imaging array to capture images of a target object, and wherein the adhesive material is cured to the partially-cured state via exposure to ultraviolet light when the target object appears in suitable focus and at a suitable position relative to the imaging array.

44. A camera sub-assembly for a vehicular camera, the camera sub-assembly comprising:
a lens barrel, wherein the lens barrel comprises (i) a cylinder having a length and a circular cross section, the cylinder commencing at a first end and terminating at a second end, the cylinder accommodating a plurality of lens optics, and (ii) an annular flange integral with and extending radially outward from the cylinder at a location between the first end and the second end of the cylinder of the lens barrel, the annular flange having an annular attaching surface at a side of the annular flange that is spaced from and faces toward the first end of the cylinder;
a lens holder comprising (i) a cylindrical lens barrel receiving structure and (ii) an annular attaching surface at an outer end of the cylindrical lens barrel receiving structure;
a printed circuit board having an imaging array disposed thereat, wherein the imaging array comprises a CMOS imaging array;
wherein the printed circuit board is mechanically attached at the lens holder;
wherein the first end of the cylinder of the lens barrel is received in the cylindrical lens barrel receiving structure of the lens holder so that the annular attaching surface of the annular flange of the lens barrel is juxtaposed with the annular attaching surface at the outer end of the cylindrical lens barrel receiving structure of the lens holder with a cured adhesive disposed therebetween, the cured adhesive contacting both of (i) the annular attaching surface at the outer end of the cylindrical lens barrel receiving structure of the lens holder and (ii) the annular attaching surface of the annular flange of the lens barrel;
wherein the cured adhesive comprises an adhesive material that is curable from an uncured state to a partially-cured state via exposure of the adhesive material to ultraviolet light, and wherein the adhesive material is further curable from the partially-cured state to a more-cured state;
wherein, with the adhesive material in the uncured state and contacting both of (i) the annular attaching surface at the outer end of the cylindrical lens barrel receiving structure of the lens holder and (ii) the annular attaching surface of the annular flange of the lens barrel, the plurality of lens optics is alignable with respect to the imaging array of the printed circuit board attached at the lens holder;
wherein, with the plurality of lens optics aligned with respect to the imaging array, the adhesive material is cured from the uncured state to the partially-cured state via exposure of the adhesive material to ultraviolet light;
wherein, with the lens barrel and the lens holder joined together by the adhesive material in the partially-cured state, the joined lens barrel and lens holder construction is moved to a further curing station;
wherein, with the joined lens barrel and lens holder construction at the further curing station, the adhesive material is further cured from the partially-cured state to the more-cured state; and
wherein, with the adhesive material in the more-cured state, the cured adhesive maintains alignment of the plurality of lens optics with respect to the imaging array for use of the camera sub-assembly for the vehicular camera on a vehicle.

45. The camera sub-assembly of claim 44, wherein the plurality of lens optics is aligned with respect to the imaging array by bringing into focus at the imaging array image data captured using the plurality of lens optics.

46. The camera sub-assembly of claim 44, wherein the printed circuit board is mechanically attached at the lens holder via at least one threaded fastener.

47. The camera sub-assembly of claim 44, wherein the printed circuit board is mechanically attached at the lens holder via a plurality of fasteners.

48. The camera sub-assembly of claim 47, wherein the plurality of fasteners comprises a plurality of threaded fasteners.

49. The camera sub-assembly of claim 48, wherein the plurality of threaded fasteners comprises a plurality of screw fasteners.

50. The camera sub-assembly of claim 44, wherein the further curing station comprises a thermal curing station.

51. The camera sub-assembly of claim 50, wherein the thermal curing station comprises an oven.

52. The camera sub-assembly of claim 44, wherein the adhesive material is further cured from the partially-cured state to the more-cured state via heating the adhesive material to a temperature of at least 85 degrees C.

53. The camera sub-assembly of claim 52, wherein the adhesive material is further cured from the partially-cured state to the more-cured state via heating the adhesive material for at least ten seconds.

54. The camera sub-assembly of claim 44, wherein the further curing station comprises multiple curing fixtures.

55. The camera sub-assembly of claim 44, wherein the further curing station comprises a moisture cure station.

56. The camera sub-assembly of claim 44, wherein the adhesive material is cured from the uncured state to the partially-cured state via exposure of the adhesive material to ultraviolet light for a first time period, and wherein the adhesive material is further cured from the partially-cured state to the more-cured state via further curing the adhesive material for a second time period, and wherein the first time period for curing the adhesive material from the uncured state to the partially-cured state is less than the second time period for further curing the adhesive material from the partially-cured state to the more-cured state.

57. The camera sub-assembly of claim 56, wherein the first time period is less than ten seconds and the second time period is greater than ten seconds.

58. The camera sub-assembly of claim 57, wherein the first time period is greater than three seconds.

59. The camera sub-assembly of claim 58, wherein the first time period is less than seven seconds.

60. The camera sub-assembly of claim 44, wherein the adhesive material is cured from the uncured state to the partially-cured state via exposure of the adhesive material to ultraviolet light for less than ten seconds.

61. The camera sub-assembly of claim 60, wherein the adhesive material is cured from the uncured state to the partially-cured state via exposure of the adhesive material to ultraviolet light for less than seven seconds.

62. The camera sub-assembly of claim 60, wherein the adhesive material is cured from the uncured state to the partially-cured state via exposure of the adhesive material to ultraviolet light for greater than three seconds.

63. The camera sub-assembly of claim 62, wherein the adhesive material is cured from the uncured state to the partially-cured state via exposure of the adhesive material to ultraviolet light for five to seven seconds.

64. The camera sub-assembly of claim 60, wherein the adhesive material is further cured from the partially-cured state to the more-cured state via further exposure of the adhesive material to ultraviolet light.

65. The camera sub-assembly of claim 64, wherein the adhesive material is further cured from the partially-cured state to the more-cured state via further exposure of the adhesive material to ultraviolet light for a period of time that is greater than ten seconds.

66. The camera sub-assembly of claim 44, wherein the adhesive material comprises an epoxy-amine adhesive material.

67. The camera sub-assembly of claim 44, wherein, prior to the first end of the cylinder of the lens barrel being inserted into the cylindrical lens barrel receiving structure of the lens holder, the adhesive material is dispensed in the uncured state at one or both of (i) the annular attaching surface at the outer end of the cylindrical lens barrel receiving structure of the lens holder and (ii) the annular attaching surface of the annular flange of the lens barrel.

68. The camera sub-assembly of claim 67, wherein the adhesive material is dispensed as a plurality of spaced apart dots of the adhesive material in the uncured state at one or both of (i) the annular attaching surface at the outer end of the cylindrical lens barrel receiving structure of the lens holder and (ii) the annular attaching surface of the annular flange of the lens barrel.

69. The camera sub-assembly of claim 67, wherein the adhesive material is dispensed as a continuous bead of the adhesive material in the uncured state at one or both of (i) the annular attaching surface at the outer end of the cylindrical lens barrel receiving structure of the lens holder and (ii) the annular attaching surface of the annular flange of the lens barrel.

70. The camera sub-assembly of claim 67, wherein the dispensed adhesive material has a thickness, in the uncured state, of up to 0.75 mm prior to aligning the plurality of lens optics with respect to the imaging array.

71. The camera sub-assembly of claim 67, wherein the adhesive material is dispensed via a servo dispenser head.

72. The camera sub-assembly of claim 71, wherein the dispensing of the adhesive material is monitored via a vision system.

73. The camera sub-assembly of claim 67, wherein, prior to dispensing the adhesive material in the uncured state, one or both of (i) the annular attaching surface at the outer end of the cylindrical lens barrel receiving structure of the lens holder is plasma-treated and (ii) the annular attaching surface of the annular flange of the lens barrel is plasma-treated.

74. The camera sub-assembly of claim 44, wherein the lens holder is configured for attaching at a camera housing to encase the printed circuit board and the imaging array.

75. A camera sub-assembly for a vehicular camera, the camera sub-assembly comprising:
 a lens barrel, wherein the lens barrel comprises (i) a cylinder having a length and a circular cross section, the cylinder commencing at a first end and terminating at a second end, the cylinder accommodating a plurality of lens optics, and (ii) an annular flange integral with and extending radially outward from the cylinder at a location between the first end and the second end of the cylinder of the lens barrel, the annular flange having an annular attaching surface at a side of the annular flange that is spaced from and faces toward the first end of the cylinder;
 a lens holder comprising (i) a cylindrical lens barrel receiving structure and (ii) an annular attaching surface at an outer end of the cylindrical lens barrel receiving structure;
 a printed circuit board having an imaging array disposed thereat;
 wherein the printed circuit board is mechanically attached at the lens holder via a plurality of fasteners;
 wherein the first end of the cylinder of the lens barrel is received in the cylindrical lens barrel receiving structure of the lens holder so that the annular attaching surface of the annular flange of the lens barrel is juxtaposed with the annular attaching surface of the lens holder at the outer end of the cylindrical lens barrel receiving structure of the lens holder with a cured adhesive disposed therebetween, the cured adhesive contacting both of (i) the annular attaching surface at the outer end of the cylindrical lens barrel receiving structure of the lens holder and (ii) the annular attaching surface of the annular flange of the lens barrel;
 wherein the cured adhesive comprises an adhesive material that is curable from an uncured state to a partially-cured state via exposure of the adhesive material to ultraviolet light, and wherein the adhesive material is further curable from the partially-cured state to a more-cured state;

wherein the adhesive material is cured from the uncured state to the partially-cured state via exposure of the adhesive material to ultraviolet light for a first time period, and wherein the adhesive material is further cured from the partially-cured state to the more-cured state via further curing the adhesive material for a second time period, and wherein the first time period for curing the adhesive material from the uncured state to the partially-cured state is less than ten seconds and wherein the second time period for further curing the adhesive material from the partially-cured state to the more-cured state is greater than ten seconds;

wherein, with the adhesive material in the uncured state and contacting both of (i) the annular attaching surface at the outer end of the cylindrical lens barrel receiving structure of the lens holder and (ii) the annular attaching surface of the annular flange of the lens barrel, the plurality of lens optics is alignable with respect to the imaging array of the printed circuit board attached at the lens holder;

wherein, with the plurality of lens optics aligned with respect to the imaging array, the adhesive material is cured from the uncured state to the partially-cured state via exposure of the adhesive material to ultraviolet light;

wherein, with the lens barrel and the lens holder joined together by the adhesive material in the partially-cured state, the joined lens barrel and lens holder construction is moved to a further curing station;

wherein, with the joined lens barrel and lens holder construction at the further curing station, the adhesive material is further cured from the partially-cured state to the more-cured state; and wherein, with the adhesive material in the more-cured state, the cured adhesive maintains alignment of the plurality of lens optics with respect to the imaging array for use of the camera sub-assembly for the vehicular camera on a vehicle.

76. The camera sub-assembly of claim 75, wherein the plurality of lens optics is aligned with respect to the imaging array by bringing into focus at the imaging array image data captured using the plurality of lens optics.

77. The camera sub-assembly of claim 75, wherein the plurality of fasteners comprises a plurality of threaded fasteners.

78. The camera sub-assembly of claim 77, wherein the plurality of threaded fasteners comprises a plurality of screw fasteners.

79. The camera sub-assembly of claim 75, wherein the further curing station comprises a thermal curing station.

80. The camera sub-assembly of claim 79, wherein the thermal curing station comprises an oven.

81. The camera sub-assembly of claim 75, wherein the adhesive material is further cured from the partially-cured state to the more-cured state via heating the adhesive material to a temperature of at least 85 degrees C.

82. The camera sub-assembly of claim 81, wherein the adhesive material is further cured from the partially-cured state to the more-cured state via heating the adhesive material for at least ten seconds.

83. The camera sub-assembly of claim 75, wherein the further curing station comprises multiple curing fixtures.

84. The camera sub-assembly of claim 75, wherein the further curing station comprises a moisture cure station.

85. The camera sub-assembly of claim 75, wherein the first time period is greater than three seconds.

86. The camera sub-assembly of claim 85, wherein the first time period is less than seven seconds.

87. The camera sub-assembly of claim 75, wherein the adhesive material is further cured from the partially-cured state to the more-cured state via further exposure of the adhesive material to ultraviolet light.

88. The camera sub-assembly of claim 75, wherein the adhesive material comprises an epoxy-amine adhesive material.

89. The camera sub-assembly of claim 75, wherein, prior to the first end of the cylinder of the lens barrel being inserted into the cylindrical lens barrel receiving structure of the lens holder, the adhesive material is dispensed in the uncured state at one or both of (i) the annular attaching surface at the outer end of the cylindrical lens barrel receiving structure of the lens holder and (ii) the annular attaching surface of the annular flange of the lens barrel.

90. The camera sub-assembly of claim 89, wherein the adhesive material is dispensed as a plurality of spaced apart dots of the adhesive material in the uncured state at one or both of (i) the annular attaching surface at the outer end of the cylindrical lens barrel receiving structure of the lens holder and (ii) the annular attaching surface of the annular flange of the lens barrel.

91. The camera sub-assembly of claim 89, wherein the adhesive material is dispensed as a continuous bead of the adhesive material in the uncured state at one or both of (i) the annular attaching surface at the outer end of the cylindrical lens barrel receiving structure of the lens holder and (ii) the annular attaching surface of the annular flange of the lens barrel.

92. The camera sub-assembly of claim 89, wherein the dispensed adhesive material has a thickness, in the uncured state, of up to 0.75 mm prior to aligning the plurality of lens optics with respect to the imaging array.

93. The camera sub-assembly of claim 89, wherein the adhesive material is dispensed via a servo dispenser head.

94. The camera sub-assembly of claim 93, wherein the dispensing of the adhesive material is monitored via a vision system.

95. The camera sub-assembly of claim 89, wherein, prior to dispensing the adhesive material in the uncured state, one or both of (i) the annular attaching surface at the outer end of the cylindrical lens barrel receiving structure of the lens holder is plasma-treated and (ii) the annular attaching surface of the annular flange of the lens barrel is plasma-treated.

96. The camera sub-assembly of claim 75, wherein the lens holder is configured for attaching at a camera housing to encase the printed circuit board and the imaging array.

* * * * *